(12) United States Patent
Yang et al.

(10) Patent No.: US 12,133,372 B2
(45) Date of Patent: Oct. 29, 2024

(54) PUMPING CAPACITOR AND SEMICONDUCTOR MEMORY DEVICE INCLUDING THE SAME

(71) Applicant: SAMSUNG ELECTRONICS CO., LTD., Suwon-si (KR)

(72) Inventors: Yooseok Yang, Suwon-si (KR); Jongwook Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 228 days.

(21) Appl. No.: 17/683,562

(22) Filed: Mar. 1, 2022

(65) Prior Publication Data

US 2023/0068172 A1 Mar. 2, 2023

(30) Foreign Application Priority Data

Aug. 31, 2021 (KR) .................. 10-2021-0115322

(51) Int. Cl.
*G11C 11/34* (2006.01)
*G11C 5/10* (2006.01)
(Continued)

(52) U.S. Cl.
CPC .............. *H10B 12/31* (2023.02); *G11C 5/10* (2013.01); *G11C 5/14* (2013.01); *G11C 5/145* (2013.01); *H01L 28/60* (2013.01)

(58) Field of Classification Search
CPC ......... H10B 12/31; H10B 12/03; H01L 28/60; H02M 3/07; H02M 3/003; G11C 5/025;
(Continued)

(56) References Cited

U.S. PATENT DOCUMENTS 6,438,034 B1 * 8/2002 Tanzawa ................ G11C 5/145
365/185.17
6,519,191 B1 * 2/2003 Morishita .............. G11C 5/145
365/189.11
(Continued)

FOREIGN PATENT DOCUMENTS

KR 100842470 B1 7/2008
KR 1020090068930 A 6/2009
(Continued)

*Primary Examiner* — Tha-O H Bui
(74) *Attorney, Agent, or Firm* — Sughrue Mion, PLLC

(57) ABSTRACT

A pumping capacitor is provided. The pumping capacitor includes: first, second, third and fourth electrodes that are separately formed on a substrate; a first pumping capacitor group, wherein i first cell capacitors have lower electrodes formed on the first pad electrode and upper electrodes connected to a plate electrode, and (n−i) first cell capacitors have lower electrodes formed on the second pad electrode and upper electrodes connected to the plate electrode; and a second pumping capacitor group, wherein i second cell capacitors have lower electrodes formed on the fourth pad electrode and upper electrodes connected to the plate electrode, and (n−i) second cell capacitors have lower electrodes formed on the third pad electrode and upper electrodes connected to the plate electrode. The first pumping capacitor group and the second pumping capacitor group are connected in series, and the second pad electrode and the third pad electrode are floated.

17 Claims, 19 Drawing Sheets

(51) Int. Cl.
*G11C 5/14* (2006.01)
*H01L 49/02* (2006.01)
*H10B 12/00* (2023.01)

(58) Field of Classification Search
CPC ... G11C 5/145; G11C 7/1066; G11C 11/4074; G11C 11/4097
USPC ............................................. 365/174
See application file for complete search history.

(56) References Cited

U.S. PATENT DOCUMENTS

| | | | |
|---|---|---|---|
| 7,107,480 B1* | 9/2006 | Moshayedi | G06F 11/1441 714/E11.138 |
| 7,301,388 B2 | 11/2007 | Kim | |
| 7,346,444 B2* | 3/2008 | Mitani | H02J 7/00308 180/117 |
| 8,531,901 B2* | 9/2013 | Ogiwara | H01L 27/0688 365/206 |
| 9,213,791 B1 | 12/2015 | Yadav et al. | |
| 9,520,776 B1* | 12/2016 | Reddy | G11C 5/145 |
| 2006/0133176 A1 | 6/2006 | Jongjun | |
| 2008/0157158 A1 | 7/2008 | Ahn | |
| 2018/0090557 A1 | 3/2018 | Kondo et al. | |
| 2018/0247998 A1 | 8/2018 | Kondo et al. | |
| 2019/0348363 A1 | 11/2019 | Ho et al. | |

FOREIGN PATENT DOCUMENTS

| | | |
|---|---|---|
| KR | 1020120086469 A | 8/2012 |
| KR | 1020210013314 A | 2/2021 |

* cited by examiner

PUMPING CAPACITOR AND SEMICONDUCTOR MEMORY DEVICE INCLUDING THE SAME

CROSS-REFERENCE TO RELATED APPLICATION

This application claims priority from Korean Patent Application No. 10-2021-0115322, filed on Aug. 31, 2021, in the Korean Intellectual Property Office, the disclosure of which is incorporated herein by reference in its entirety.

BACKGROUND

1. Field

The present disclosure relates to a pumping capacitor and a semiconductor memory device including the same.

2. Description of Related Art

A pumping voltage generator includes at least one pumping capacitor and may generate a pumping voltage higher than a power supply voltage or lower than a ground voltage by pumping the at least one pumping capacitor according to a pumping control signal.

A semiconductor memory device may include pumping voltage generators, such as a high voltage generator circuit that generates a voltage higher than a power supply voltage and a substrate voltage generator circuit that generates a substrate voltage lower than a ground voltage.

SUMMARY

One or more example embodiments provide a pumping capacitor capable of obtaining a desired pumping capacitance using cell capacitors and a semiconductor memory device including the same.

Example embodiments are not limited to the tasks mentioned above, and other tasks which are not mentioned will be clearly understood by those skilled in the art from the following description.

A pumping capacitor in accordance with an example embodiment includes: a first pad electrode, a second pad electrode, a third pad electrode, and a fourth pad electrode separately formed on a substrate; a first pumping capacitor group including n first cell capacitors, wherein i first cell capacitors of the n first cell capacitors have lower electrodes formed on the first pad electrode and upper electrodes connected to a plate electrode, and (n–i) first cell capacitors of the n first cell capacitors have lower electrodes formed on the second pad electrode and upper electrodes connected to the plate electrode; and a second pumping capacitor group including n second cell capacitors, wherein i second cell capacitors of the n second cell capacitors have lower electrodes formed on the fourth pad electrode and upper electrodes connected to the plate electrode, and (n–i) second cell capacitors of the n second cell capacitors have lower electrodes formed on the third pad electrode and upper electrodes connected to the plate electrode. The first pumping capacitor group and the second pumping capacitor group are connected in series, the second pad electrode and the third pad electrode are floated, and n and i are positive integers.

A semiconductor memory device in accordance with an example embodiment includes: a plurality of memory cell array banks, each including a plurality of memory cells provided in a predetermined pattern between a plurality of sub word lines and a plurality of bit lines on a substrate; and a plurality of pumping voltage generators each including at least one pumping capacitor provided in a peripheral circuit area on the substrate. Each of the plurality of memory cells includes an access transistor and a first cell capacitor. The at least one pumping capacitor includes a first sub pumping capacitor group including n second cell capacitors and a second sub pumping capacitor group including n third cell capacitors. The first sub pumping capacitor group and the second sub pumping capacitor group are connected in series, wherein i second cell capacitors among the n second cell capacitors of the first sub pumping capacitor group are connected in parallel, (n–i) second cell capacitors of the first sub pumping capacitor group are floated, i third cell capacitors among the n third cell capacitors of the second sub pumping capacitor group are connected in parallel, and (n–i) third cell capacitors of the second sub pumping capacitor group are floated, and n and i are positive integers.

A memory system in accordance with an example embodiment includes: a controller; and a semiconductor memory device configured to transceive data based on a command and an address provided by the controller. The semiconductor memory device includes: a plurality of memory cell array banks, each including a plurality of memory cells provided in a predetermined pattern between a plurality of sub word lines and a plurality of bit lines on a substrate; and a plurality of pumping voltage generators each including at least one pumping capacitor provided in a peripheral circuit area on the substrate. Each of the plurality of memory cells includes an access transistor and a first cell capacitor, the at least one pumping capacitor includes a first sub pumping capacitor group including n second cell capacitors and a second sub pumping capacitor group including n third cell capacitors, the first sub pumping capacitor group and the second sub pumping capacitor group are connected in series, i second cell capacitors among the n second cell capacitors of the first sub pumping capacitor group are connected in parallel, (n–i) second cell capacitors of the first sub pumping capacitor group are floated, i third cell capacitors among the n third cell capacitors of the second sub pumping capacitor group are connected in parallel, (n–i) third cell capacitors of the second sub pumping capacitor group are floated, and n and i are positive integers.

BRIEF DESCRIPTION OF THE DRAWINGS

The above and other aspects will be more apparent from the following description of example embodiments taken in conjunction with the accompanying drawings, in which.

DETAILED DESCRIPTION

Hereinafter, example embodiments will be described with reference to the accompanying drawings.

Figure 1:
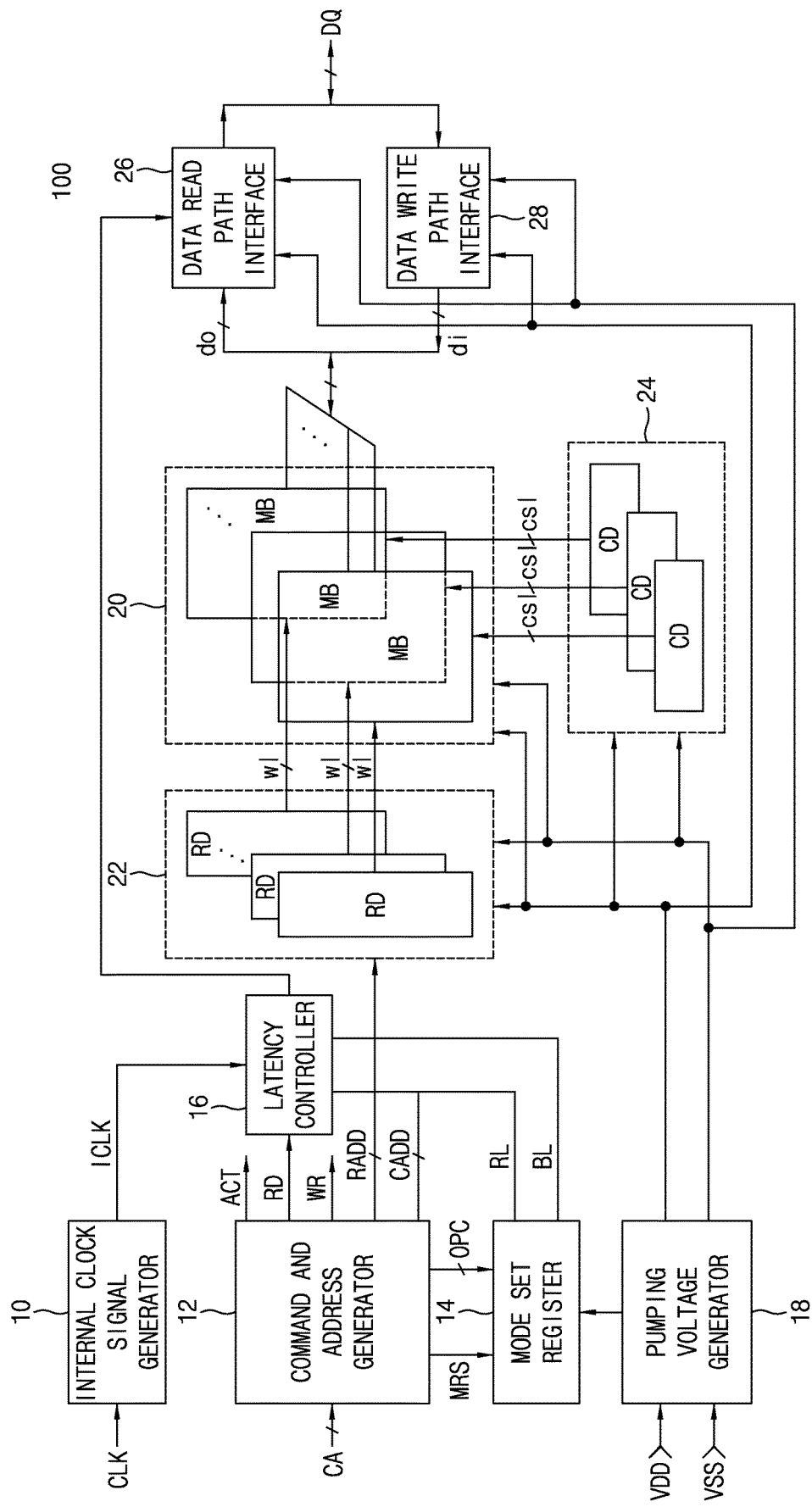
FIG. 1 is a block diagram of a semiconductor memory device according to an example embodiment.

FIG. 1 is a block diagram of a semiconductor memory device according to an example embodiment. The semiconductor memory device 100 may include an internal clock signal generator 10, a command and address generator 12, a mode set register 14, a latency controller 16, a pumping voltage generator 18, a memory cell array 20, a row decoder 22, a column decoder 24, a data read path interface 26, and a data write path interface 28.

The components shown in FIG. 1 will be described as follows.

The internal clock signal generator 10 may generate an internal clock signal ICLK locked to an external clock signal CLK. For example, the internal clock signal generator 10 may be a delay locked loop.

The command and address generator 12 may decode a command signal included in a command and address CA applied from the outside to generate an active command ACT, a read command RD, a write command WR, and a mode set command MRS. In addition, the command and address generator 12 may generate an address signal included in the command and address CA as a mode set code OPC based on the mode set command MRS, generate an address signal included in the command and address CA as a row address RADD based on the active command ACT, and generate the address signal included in the command and address CA as a column address based on the read command RD or the write command WR.

The mode set register 14 may store the mode set code OPC based on the mode set command MRS and set a read latency RL and a burst length BL.

The latency controller 16 may generate a latency signal LA that is activated after being delayed by the number of clock cycles corresponding to the read latency RL and deactivated after being delayed by a sum of the number of clock cycles corresponding to the read latency RL and the number of clock cycles corresponding to the burst length BL, using the internal clock signal ICLK when the read command RD is generated.

The pumping voltage generator 18 may pump the power supply voltage VDD to generate a high voltage VPP higher than the power supply voltage, and pump the ground voltage VSS to generate a substrate voltage VBB lower than the ground voltage. The high voltage VPP and the substrate voltage VBB are supplied to the memory cell array 20, the row decoder 22, the column decoder 24, the data read path interface 26, and the data write path interface 28.

The memory cell array 20 includes a plurality of memory cell array banks MB, and each of the plurality of memory cell array banks MB may output read data do or store write data di.

The row decoder 22 may include a plurality of row decoders RD, and each of the plurality of row decoders RD may decode a row address RADD to generate a plurality of word line selection signals wl.

The column decoder 24 may include a plurality of column decoders CD, and each of the plurality of column decoders RD may decode a column address CADD to generate a plurality of column selection signals csl.

The data read path interface 26 may receive the read data do output from the memory cell array 20 and output output data DQ based on the internal clock signal ICLK during an activation period of the latency signal LA.

The data write path interface 28 may receive input data DQ and output the write data di to the memory cell array 20.

Figure 2:
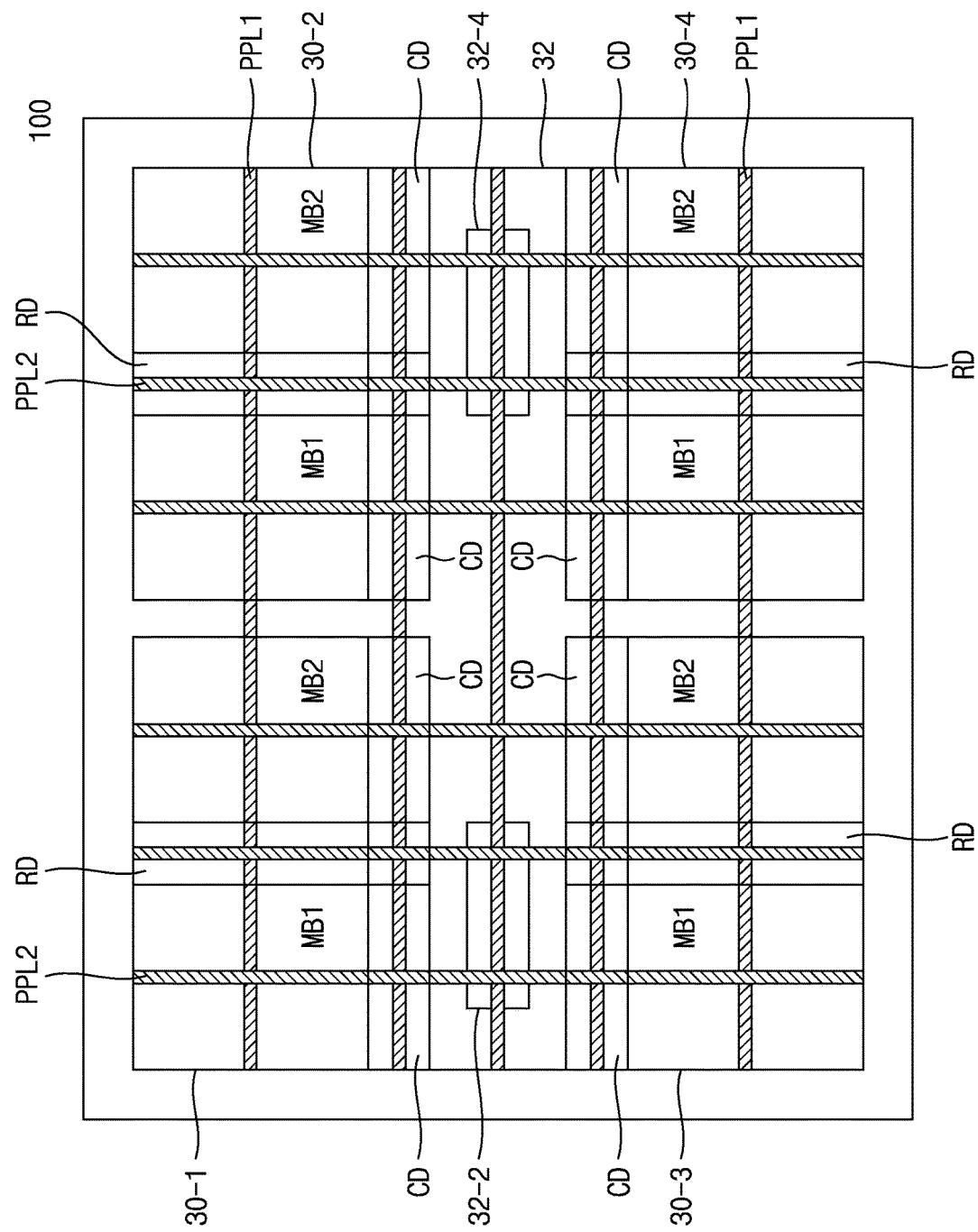
FIG. 2 is a diagram showing an arrangement of a semiconductor memory device according to an example embodiment.

FIG. 2 is a diagram showing an arrangement of a semiconductor memory device according to an example embodiment.

The arrangement of the semiconductor memory device will be described with reference to FIG. 2 as follows.

The semiconductor memory device 100 may include first to fourth memory cell array areas 30-1 to 30-4 and a peripheral circuit area 32.

The memory cell array 20, the row decoder 22, and the column decoder 24 shown in FIG. 1 may be disposed in the first to fourth memory cell array areas 30-1 to 30-4. If the memory cell array 20 includes four memory bank groups and each of the four memory bank groups includes two memory cell array banks MB1 and MB2, two memory cell array banks MB1 and MB2 may be disposed in each of the first to fourth memory cell array areas 30-1 to 30-4. Each row decoder RD may be disposed between the memory cell array banks MB1 and MB2 and each column decoder CD may be disposed between each of the memory cell array banks MB1 and MB2 and the peripheral circuit area 32.

The peripheral circuit area 32 may be disposed between the first and second memory cell array areas 30-1 and 30-2 and the third and fourth memory cell array areas 30-3 and 30-4. Pumping voltage generators 32-2 and 32-4 included in the pumping voltage generator 18 may be disposed in the peripheral circuit area 32. Each of the pumping voltage generators 32-2 and 32-4 may include a high voltage generator and a substrate voltage generator. A predetermined number of pumping voltage generators 32-2 and 32-4 may be disposed at a predetermined number of different positions in the peripheral circuit area 32. In addition, the internal clock signal generator 10, the command and address generator 12, the mode set register 14, and the latency controller 16, the data read path interface 26, and the data write path interface 28 shown in FIG. 1 may be additionally disposed in the peripheral circuit area 32.

First power lines PPL1 may be disposed on the first to fourth memory cell array areas 30-1 to 30-4 and may extend in a first direction (horizontal direction), and second power lines PPL2 may be disposed on the first power lines PPL1 and may extend in a second direction (vertical direction) perpendicular to the first direction. The first power lines PPL1 and the second power lines PPL2 may be disposed in a mesh form. For example, the first power lines PPL1 may be lines transmitting the high voltage VPP and the second power lines PPL2 may be lines transmitting the substrate voltage VBB. That is, the high voltage VPP output from each of the pumping voltage generators 32-2 and 32-4 may be supplied through the first power lines PPL1, and the substrate voltage VBB may be supplied through the second power lines PPL2.

Figure 3:
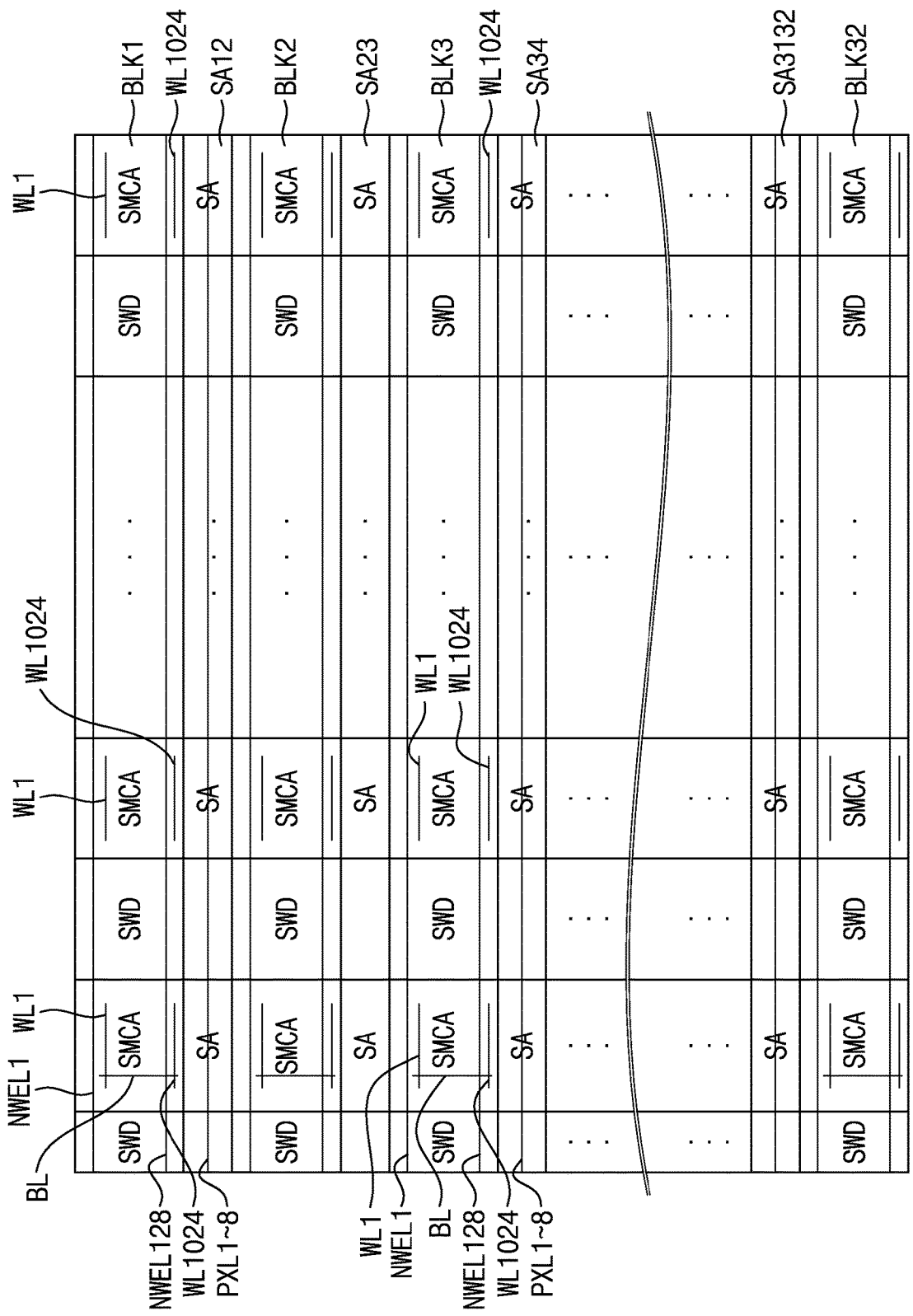
FIG. 3 is a diagram showing a memory cell array bank according to an example embodiment.

FIG. 3 is a diagram showing a memory cell array bank according to an example embodiment.

The memory cell array bank MB (MB1 or MB2) shown in FIG. 3 will be described as follows.

The memory cell array bank MB may include 32 memory cell array blocks BLK1 to BLK32 and 31 sense amplification blocks SA12 to SA3132. Each of the 32 memory cell array blocks BLK1 to BLK32 may include n sub memory cell array blocks SMCA11 to SMCA1n, SMCA21 to SMCA2n, . . . , or SMCA321 to SMCA32n and $n$ sub word line driver blocks SWD11 to SWD1n, SWD21 to SWD2n, . . . , or SWD321 to SWD32n, and each of the 31 sense amplification blocks SA12 to SA3132 may include n sub sense amplification blocks SA121 to SA12n, SA231 to SA23n, . . . , or SA31321 to SA3132n and junction area blocks CJ121 to CJ12n, CJ231 to CJ23n, . . . , or CJ31321 to CJ3132n. 128 main word lines NWEL1 to NWEL128 and 1024 sub word lines WL1 to WL1024 may be disposed in each of the 32 memory cell array blocks BLK1 to BLK32. Each of the 32 memory cell array blocks BLK1 to BLK32 may include a plurality of dynamic memory cells connected between the 1024 sub word lines WL1 to WL1024 and a plurality of bit lines BL. Only one representative bit line among the plurality of bit lines BL of each of the memory cell array blocks BLK1 to BLK32 is shown in the figure. Each of the 31 sense amplification blocks SA12 to SA3132 may be disposed between adjacent memory cell array blocks. Eight word line selection signal lines PXL1 to PXL8 may be disposed in each of the 31 sense amplification blocks SA12 to SA3132.

A sub word line driver block SWD11, . . . SWD1n, SWD21, . . . , SWD2n, . . . , SWD321, . . . , or SWD32n disposed on the left side of each of the sub memory cell array blocks SMCA11 to SMCA1n, SMCA21 to SMCA2n, . . . , and SMCA321 to SMCA32n may select one of the sub word lines WL1 to WL1024 when one of the main word lines NWEL1 to NWEL128 and one of the word line selection signal lines PXL1 to PXL8 are selected. For example, the sub word line driver blocks SWD11 to SWD1n, SWD21 to SWD2n, . . . , or SWD321 to SWD32n of each of the memory cell array blocks BLK1 to BLK32 may select sub word lines WL1 of sub memory cell array blocks SMCA11 to SMCA1n, SMCA21 to SMCA2n, . . . , or SMCA321 to SMCA32n of each of the memory cell array blocks BLK1 to BLK32 when the main word line NWEL1 is selected and the word line selection signal line PXL1 of each of the sense amplification blocks SA12 to SA3132 is selected. The sub word line driver blocks SWD11 to SWD1n, SWD21 to SWD2n, . . . , or SWD321 to SWD32n of each of the memory cell array blocks BLK1 to BLK32 may select sub word lines WL1024 of sub memory cell array blocks SMCA11 to SMCA1n, SMCA21 to SMCA2n, . . . , or SMCA321 to SMCA32n of each of the memory cell array blocks BLK1 to BLK32 when the main word line NWEL128 of each of the memory array cell blocks BLK1 to BLK32 is selected and the word line selection signal line PXL8 of each of the sense amplification blocks SA12 to SA3132 is selected. That is, the sub word lines WL1 to WL1024 of the sub memory cell array blocks SWD11 to SWD1n, SWD21 to SWD2n, . . . , or SWD321 to SWD32n of each of the memory cell array blocks BLK1 to BLK32 may be selected when one of the main word lines NWEL1 to NWEL128 and one of the word line selection signal lines PXL1 to PXL8 are selected.

Figure 4:
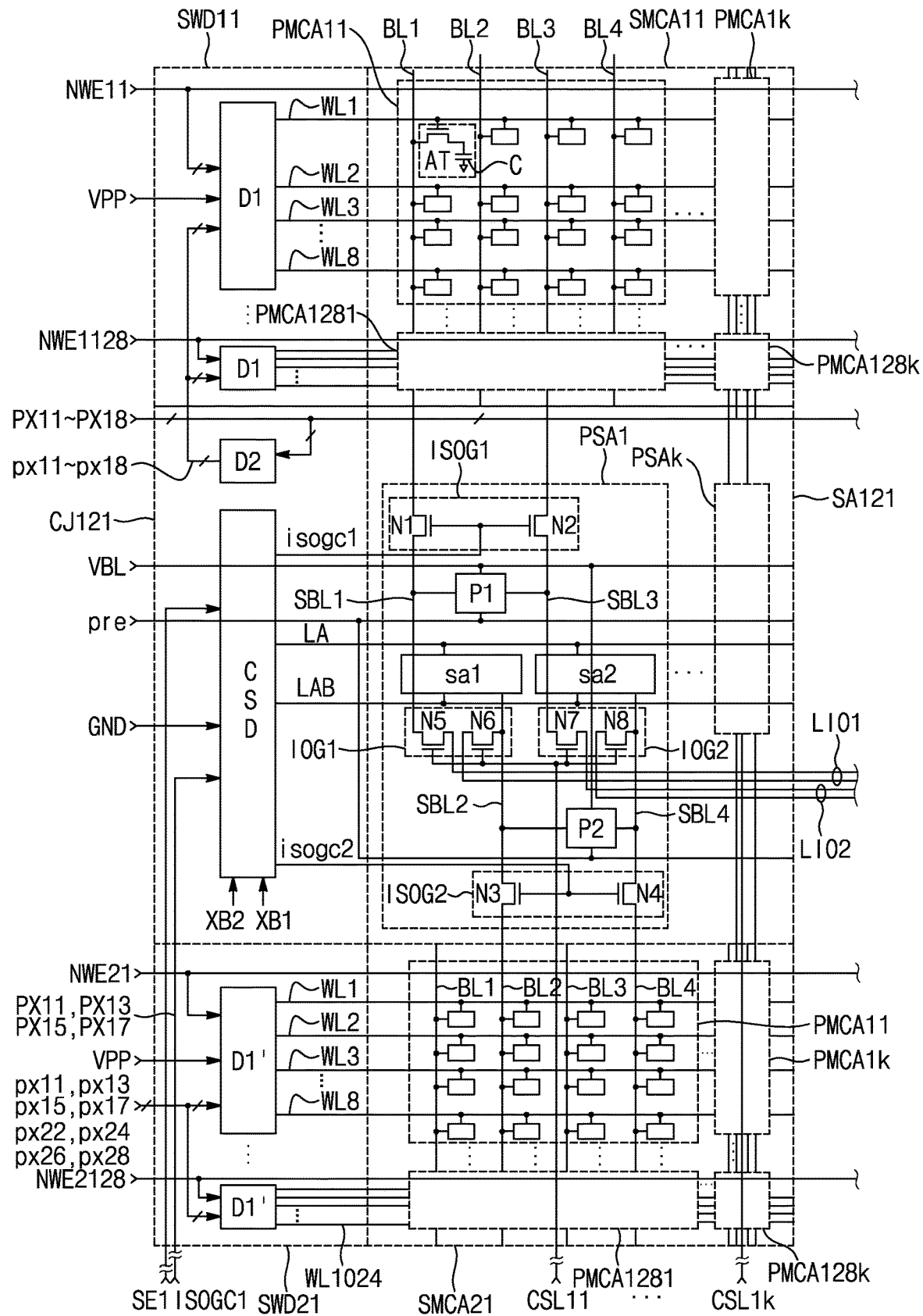
FIG. 4 is a diagram showing a detailed configuration of a part of a memory cell array bank according to an example embodiment.

FIG. 4 is a diagram showing a detailed configuration of a part of a memory cell array bank according to an example embodiment, and shows detailed configurations of the sub word line driver block SWD11, the sub memory cell array block SMCA11, the junction area block CJ121, the sub sense amplification block SA121, the sub word line driver block SWD21, and the sub memory cell array block SMCA21 of the memory cell array bank MB.

Referring to FIG. 4, each of the sub memory cell array blocks SMCA11 and SMCA21 may include 128×k partial blocks PMCA11 to PMCA1k, . . . , PMCA1281 to PMCA128k. Each of the 128×k partial blocks PMCA11 to PMCA1k, . . . , PMCA1281 to PMCA128k may include 32 dynamic memory cells MC connected between 8 sub word lines WL1 to WL8 and 4 odd and even bit lines BL1 to BL4. The memory cells MC may be dynamic memory cells.

The memory cell array bank MB may have an open bit line structure in which the odd bit lines BL1 and BL3 in the sub memory cell array block SMCA11 are paired, and the even bit lines BL2 and BL4 in the sub memory cell array block SMCA21 are paired.

The sub word line driver block SWD11 may include sub word line drivers D1. Each of the sub word line drivers D1 may be provided with the high voltage VPP and may select 8 sub word lines WL1 to WL8 in the sub memory cell array block SMCA11 by driving sub word line driving selection signals px11 to px18 generated from the junction area block CJ121 based on a corresponding main word line selection signal NWE11, . . . , or NWE1128. Each of the sub word line drivers D1 may be provided with the high voltage VPP and may transmit the high voltage VPP through the selected sub word lines. The sub word line driver block SWD21 may include sub word line drivers D1'. Each of the sub word line drivers D1' may select 8 sub word lines WL1 to WL8 in the sub memory cell array block SMCA21 by driving sub word line driving selection signals px11, px13, px15, and px17 generated from the junction area block CJ121 and sub word line driving selection signals px22, px24, px26, and px28 generated from the junction area block CJ231 based on a corresponding main word line selection signal NWE21, . . . , or NWE2128. Each of the sub word line drivers D1' may be provided with the high voltage VPP and may transmit the high voltage VPP through the selected sub word lines. The sub word line drivers D1' may include PMOS transistors and NMOS transistors, the bodies of the PMOS transistors may be connected to the high voltage VPP, and the bodies of the NMOS transistors may be connected to the substrate voltage VBB.

The junction area block CJ121 may include a sub word line selection signal driver D2 and a control signal driver CSD. The sub word line selection signal driver D2 may generate the sub word line driving selection signals px11 to px18 by driving the sub word line selection signals PX11 to PX18 based on a Y block selection signal YB1. The Y block selection signal YB1 may be generated by decoding some bits of the column address CADD. The control signal driver CSD may generate first and second bit line isolation gate driving control signals isogc1 and isogc2 and a sense amplification voltage pair LA and LAB based on an X block selection signal XB1 or XB2, a bit line isolation gate control signal ISOGC1, and a sense amplifier control signal SE1. The sense amplification block SA121 may include k sense amplification circuits PSA1 to PSAk including precharge circuits P1 and P2, sense amplifiers sa1 and sa2, first and second bit line isolation gates ISOG1 and ISOG2, and input/output gates IOG1 and IOG2. The precharge circuits P1 and P2 may perform a precharge operation of precharging the odd bit lines BL1 and BL3 included in the sub memory cell array block MCA11, the even bit lines BL2 and BL4 included in the sub memory cell array block MCA21, and sense bit lines SBL1 to SBL4 included in the sub sense amplification block SA121 with a precharge voltage VBL based on a precharge control signal pre. The sense amplifiers sa1 and sa2 in the sense amplification circuits PSA1 to PSAk included in the sub sense amplification block SA121 may amplify data of odd sense bit lines SBL1 and SBL3 connected to the odd bit lines BL1 and BL3 of the sub memory cell array block SMCA11 and even sense bit lines SBL2 and SBL4 connected to the even bit lines BL2 and BL4 of the sub memory cell array block SMCA21 based on the sense amplification voltage pair LA and LAB. The first bit line isolation gate ISOG1 of each of the sense amplifier circuits PSA1 to PSAk included in the sub sense amplification block SA121 may include NMOS transistors N1 and N2 for connecting the odd bit lines BL1 and BL3 of the cell array block SMCA11 and the odd sense bit lines SBL1 and SBL3 of the sub sense amplification block SA121 by being turned on based on the first bit line isolation gate driving control signal isogc1. The second bit line isolation gate ISOG2 of each of the sense amplification circuits PSA1 to PSAk included in the sub sense amplification block SA121 may include NMOS transistors N3 and N4 for connecting the even bit lines BL2 and BL4 of the cell array block SMCA21 and the even sense bit lines SBL2 and SBL4 of the sub sense amplification block SA121 by being turned on based on the second bit line isolation gate driving control signal isogc2. The input/output gate IOG1 of each of the sense amplification circuits PSA1 to PSAk included in the sub sense amplification block SA121 may include NMOS transistors N5 and N6 for connecting the sense bit lines SBL1 and SBL2 and an input/output line pair LIO1 by being turned on based on corresponding column selection signals CSL11 to CSL1k. The input/output gate IOG2 of each of the sense amplification circuits PSA1 to PSAk included in the sub sense amplification block SA121 may include NMOS transistors N7 and N8 for connecting the sense bit lines SBL3 and SBL4 and an input/output line pair LIO2 by being turned on based on corresponding column selection signals CSL11 to CSL1k. The body of each of the NMOS transistors N1 to N8 may be connected to the substrate voltage VBB.

Figure 5:
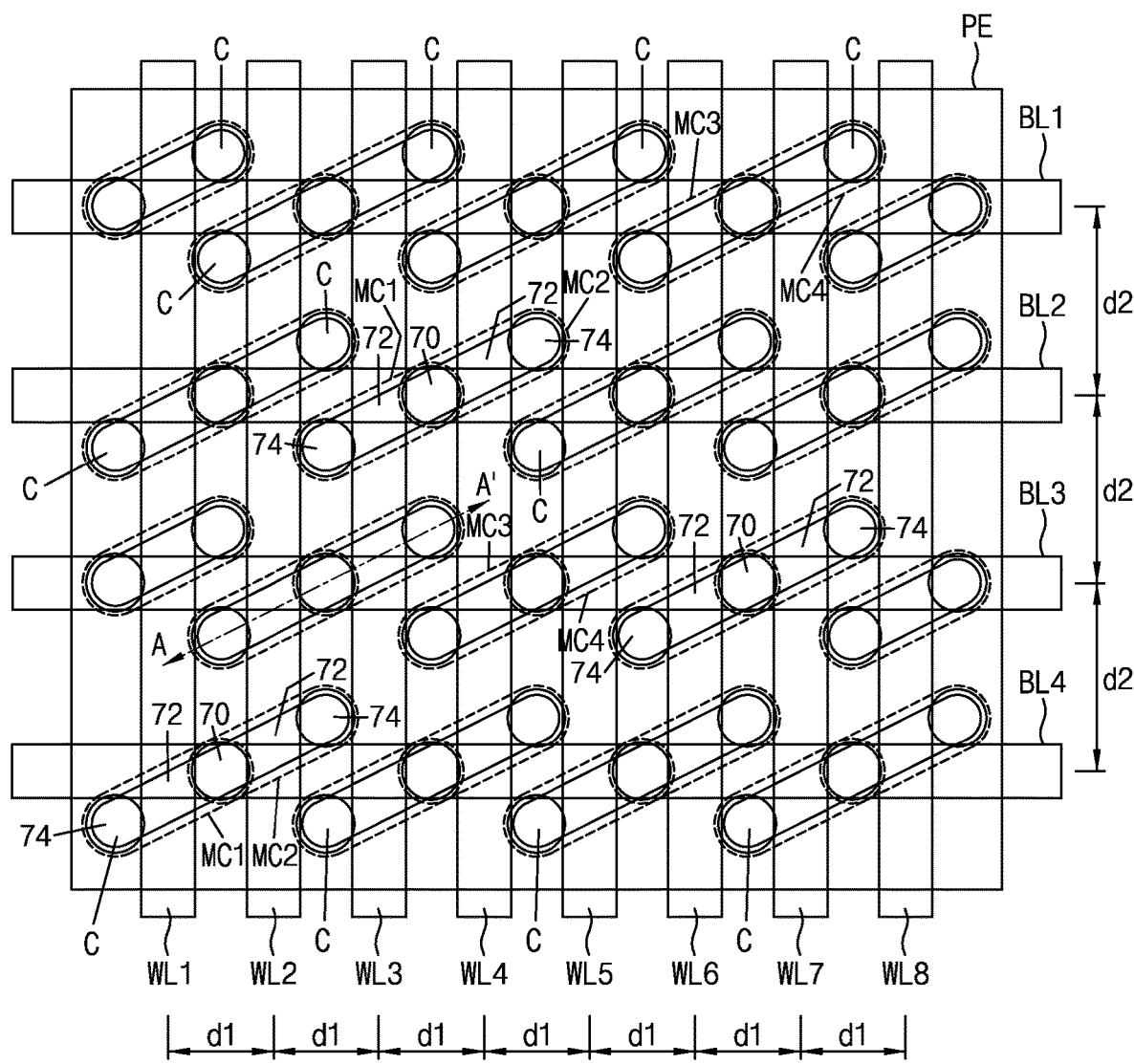
FIG. 5 is a plan view illustrating an arrangement of memory cells in a partial block of a sub memory cell array block according to an example embodiment.
Figure 6:
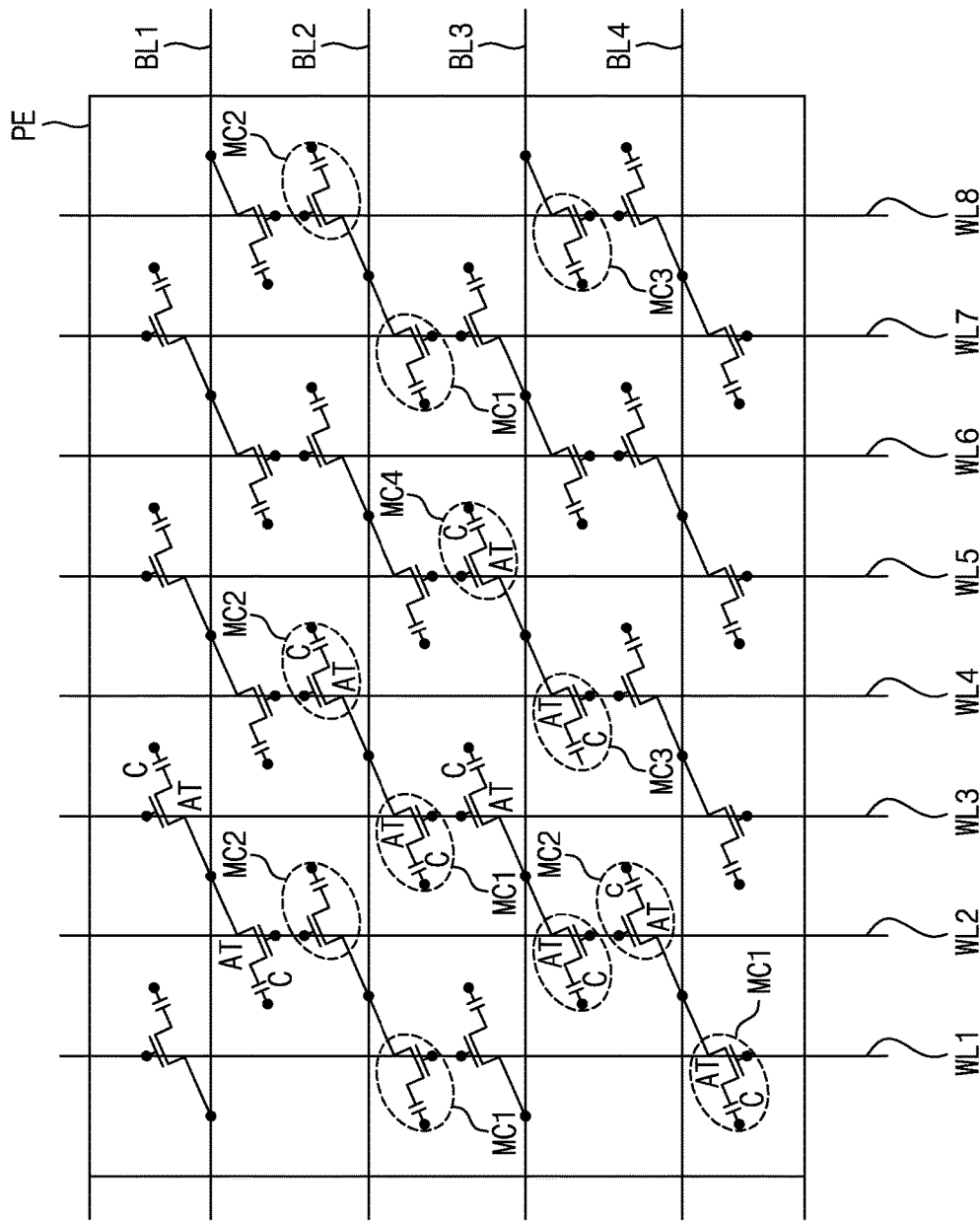
FIG. 6 shows a circuit configuration according to the arrangement of FIG. 5 according to an example embodiment.

FIG. 5 is a plan view illustrating an arrangement of memory cells in a partial block of a sub memory cell array block according to an example embodiment and FIG. 6 shows a circuit configuration according to the arrangement of FIG. 5 according to an example embodiment.

The arrangement of the partial blocks PMCA will be described with reference to FIGS. 5 and 6.

The sub word lines WL1 to WL8 may be disposed at an equal interval of a first distance d1, and the bit lines BL1 to BL4 may be disposed at an equal interval of a second distance d2 in a direction perpendicular to the sub word lines WL1 to WL8. The first distance d1 and the second distance d2 may be identical or similar to each other. Memory cells MC1 to MC4 may be disposed between areas in which the sub word lines WL1 to WL8 are disposed and areas in which the bit lines BL1 to BL4 are disposed. Contacts are disposed in areas in which even bit lines BL2 and BL4 are disposed between two adjacent sub word lines WL1 to WL8 (i.e., on bit lines BL2 and BL4 between WL1 and WL2, on bit lines BL2 and BL4 between WL3 and WL4, on bit lines BL2 and BL4 between WL5 and WL6, on bit lines BL2 and BL4 between WL7 and WL8), each of which corresponds to a common active area 70 of an access transistor AT of the memory cell MC1 and an access transistor AT of the memory cell MC2. Contacts are also disposed areas in which odd bit lines BL1 and BL3 are disposed between two adjacent sub word lines WL2 to WL7 (i.e., on bit lines BL1 and BL3 between WL2 and WL3, on bit lines BL1 and BL3 between WL4 and WL5, on bit lines BL1 and BL3 between WL6 and WL7), each of which corresponds to a common active area 70 of an access transistor AT of the memory cell MC3 and an access transistor AT of the memory cell MC4. Gate regions 72 and active regions 74 of the access transistors AT of the memory cells MC1 to MC4 are sequentially disposed in a diagonal direction with respect to the common active region 70. A gate G formed in the gate region 72 becomes a word line WL, and a cell capacitor C of each of the memory cells MC1 to MC4 may be disposed on the active region 74. A plate electrode PE connected to each of the memory cells MC1 to MC4 may be disposed on the partial block PMCA. That is, the memory cells MC1 to MC4 of the partial block PMCA of the sub memory cell array block SMCA may be arranged in a predetermined pattern.

Figure 7:
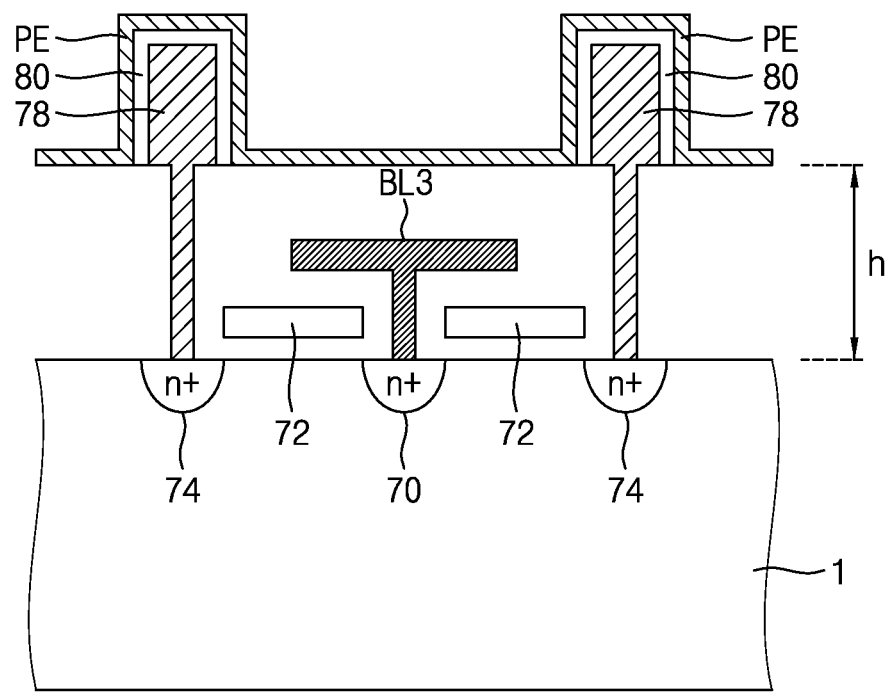
FIG. 7 is a schematic cross-sectional view taken along line A-A' of a part of the partial block shown in FIG. 5 according to an example embodiment.

FIG. 7 is a schematic cross-sectional view taken along line A-A' of a part of the partial block shown in FIG. 5 according to an example embodiment.

n+ active regions 74 and an n+ common active region 70 may be formed in a p-type substrate 1, gates may be formed in gate regions 72 on the p-type substrate 1 between the n+ active regions 74 and the n+ common active region 70. The gates may be the word lines WL2 and WL3. An access transistor AT of each of the memory cells MC3 and MC4 may be formed by the n+ active regions 74, the n+ common active region 70, and the gate. The bit line BL3 connected to the n+ common active region 70 may be formed above the gate regions 72, and a lower electrode 78 of a cell capacitor C of each of the memory cells MC3 and MC4 may be formed on each of the n+ active regions 74. In addition, a dielectric 80 may be formed around (i.e., surround) and over (i.e., cover) the lower electrode 78 of the cell capacitor C of each of the memory cells MC1 and MC3, and a plate electrode PE that is an upper electrode of each of the memory cells MC1 and MC3 may be formed on the dielectric 80. The plate electrode PE may be an upper electrode common to the cell capacitors C of the memory cells MC1 to MC4. The cell capacitors C may be formed at a height h from the p-type substrate 1.

Figure 8:
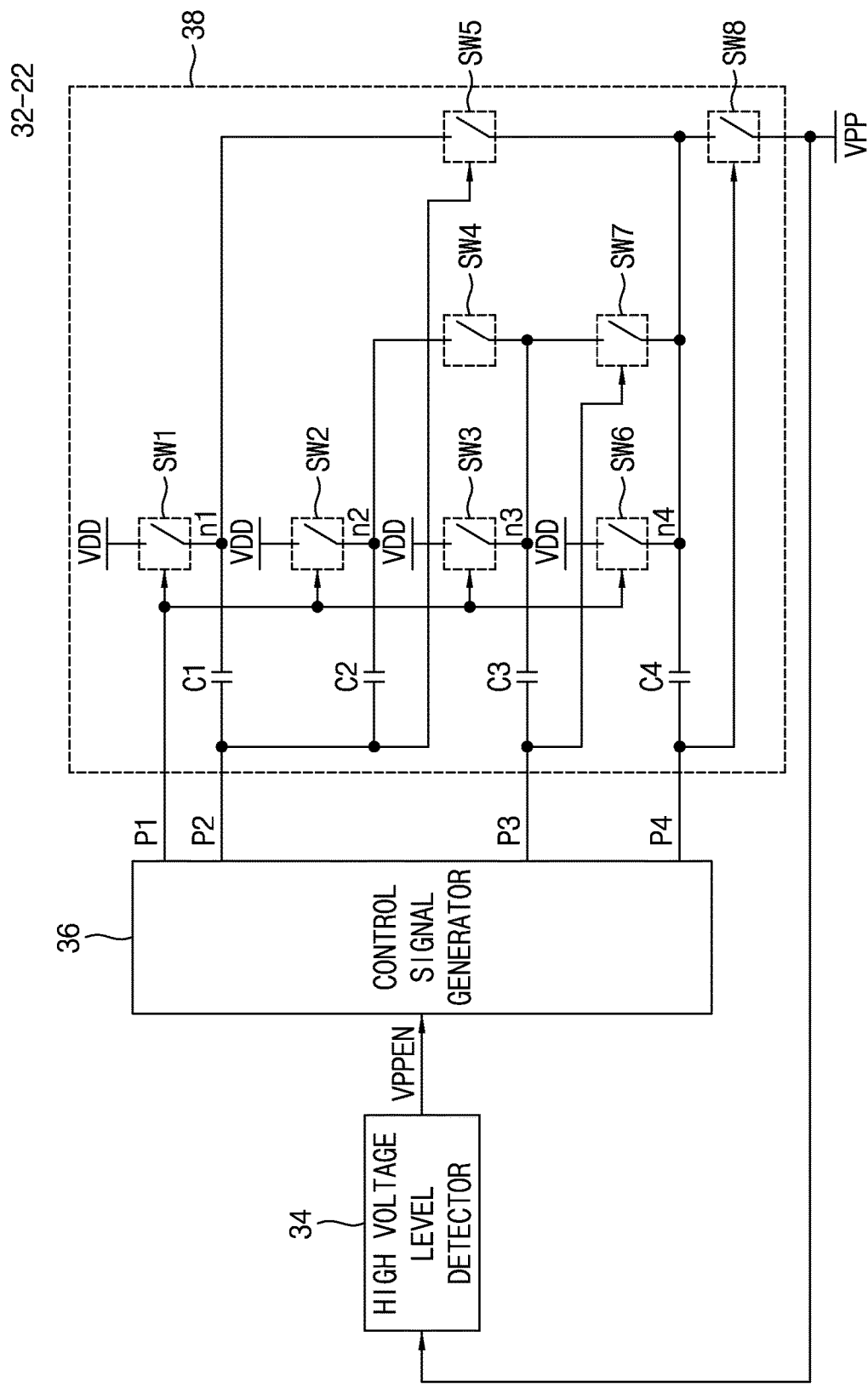
FIG. 8 is a diagram showing a configuration of a pumping voltage generator according to an example embodiment.

FIG. 8 is a diagram showing a configuration of a pumping voltage generator according to an example embodiment, and illustrates a high voltage generator included in each of the pumping voltage generators 32-2 and 32-4 shown in FIG. 2. The high voltage generator 32-22 may include a high voltage level detector 34, a control signal generator 36, and a high voltage pumping device 38, and the high voltage pumping device 38 may include pumping capacitors C1 to C4 and switches SW1 to SW8.

The components shown in FIG. 8 will be described as follows.

The high voltage level detector 34 detects the level of the high voltage VPP and generates a high voltage level detection signal VPPEN when the level of the high voltage VPP is lower than a target level of the high voltage VPP.

The control signal generator 36 generates a precharge control signal P1 and pumping control signals P2 to P4 based on the high voltage level detection signal VPPEN.

The switches SW1, SW2, SW3, and SW6 precharge nodes n1, n2, n3, and n4 to a voltage level VDD based on the precharge control signal P1. The pumping capacitors C1 and C2 pump the nodes n1 and n2 based on the pumping control signal P2. The capacitor C3 pumps the node n3 based on the pumping control signal P3, and the capacitor C4 pumps the node n4 based on the pumping control signal P4. A ratio of capacitances of the pumping capacitors C1, C2, C3, and C4 may be designed to be $1:\alpha:\alpha:\alpha^2$. For example, the pumping capacitors C1, C2, C3, and C4 may be designed to have capacitance values of C, 2C, 2C (i.e., $\alpha$ is 2), and 4C or C, 3C, 3C, and 9C (i.e., $\alpha$ is 3). When the switches SW4 and SW5 are turned on based on the pumping control signal P2, an operation of sharing charges between the capacitors C1 and C4 and between the capacitors C2 and C3 may be performed. When the switch SW7 is turned on based on the pumping control signal P3, an operation of sharing charges between the capacitors C3 and C4 may be performed. When the switch SW8 is turned on based on the pumping control signal P4, an operation of sharing charges between the capacitor C4 and a high voltage generation terminal may be performed. Accordingly, the high voltage VPP can be generated at the high voltage generation terminal.

Figure 9:
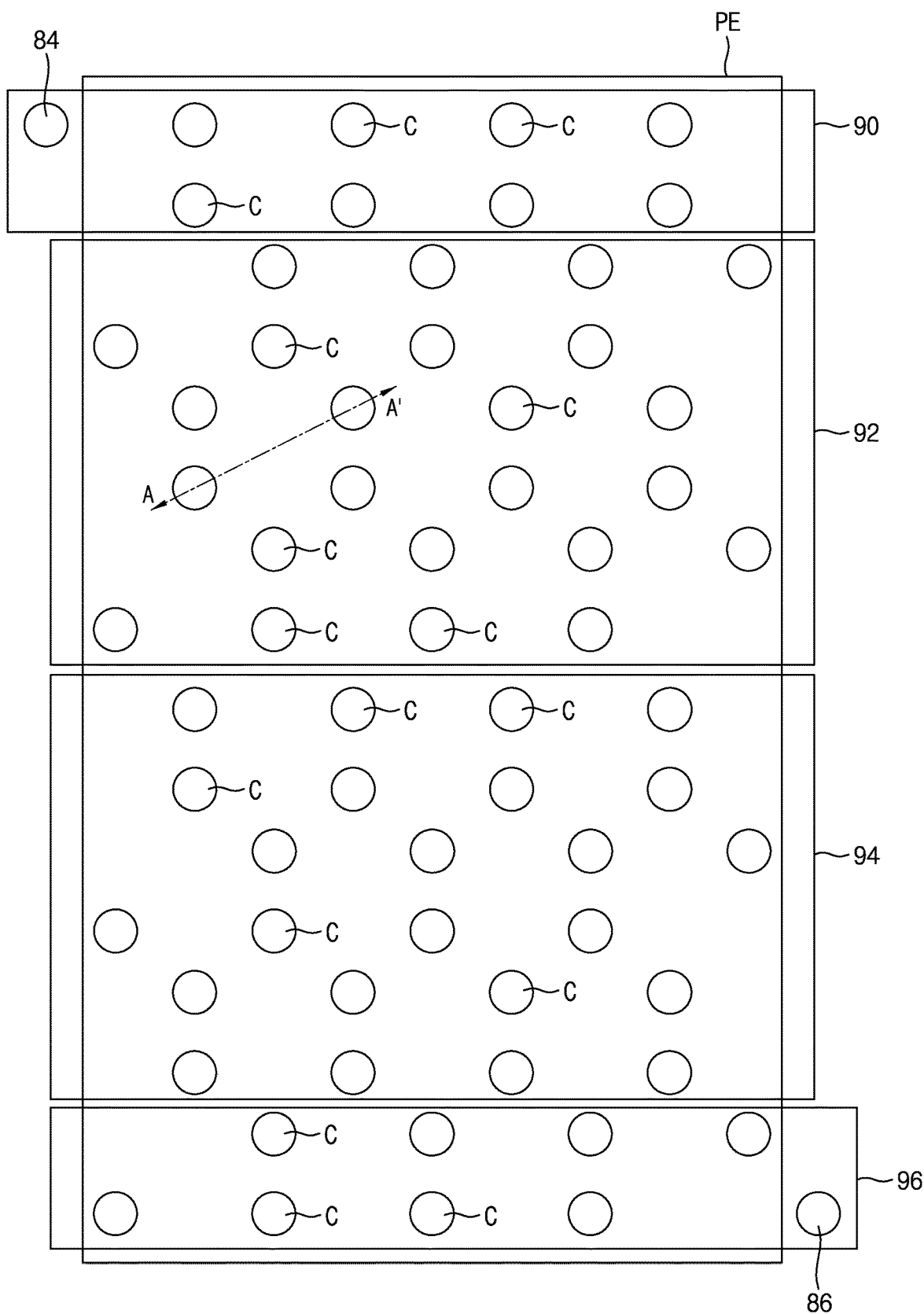
FIG. 9 is a plan view illustrating an arrangement of a pumping capacitor according to an example embodiment.

FIG. 9 is a plan view illustrating an arrangement of a pumping capacitor according to an example embodiment.

The arrangement of the pumping capacitor C1 will be described with reference to FIG. 9 as follows.

The pumping capacitor C1 may include cell capacitors C of memory cells provided on a partial block PMCA in a manner similar to the memory cells MC1 to MC4 of the partial block PMCA discussed above with respect to FIGS. 5 to 7, but does not include the word lines WL1 to WL8, the bit lines BL1 to BL4, or the access transistors AT of the memory cells MC1 to MC4. The cell capacitors C of the pumping capacitor C1 may be repeatedly disposed in the same manner as the cell capacitors C of the partial block PMCA, that is, in the same pattern (at equal intervals).

A first pad electrode may be disposed in a first pad electrode region 90, a second pad electrode may be disposed in a second pad electrode region 92, a third pad electrode may be disposed in a third pad electrode region 94, and a fourth pad electrode may be disposed in a fourth pad electrode region 96. A contact connected to a signal line to which the pumping control signal P2 is applied may be disposed in a contact region 84 on one side of the first pad electrode region 90, and a contact connected to the node n1 may be disposed in a contact region 86 on one side of the fourth pad electrode region 96. The second pad electrode and the third pad electrode may be floated. The first to fourth pad electrodes may be separately disposed on the substrate.

8 cell capacitors C may be disposed on the first pad electrode, 24 cell capacitors C may be disposed on the second pad electrode, 24 cell capacitors C may be disposed on the third pad electrode, and 8 cell capacitors (C) may be disposed on the fourth pad electrode. The plate electrode PE serving as upper electrodes of the 64 cell capacitors C may be disposed.

Figure 10:
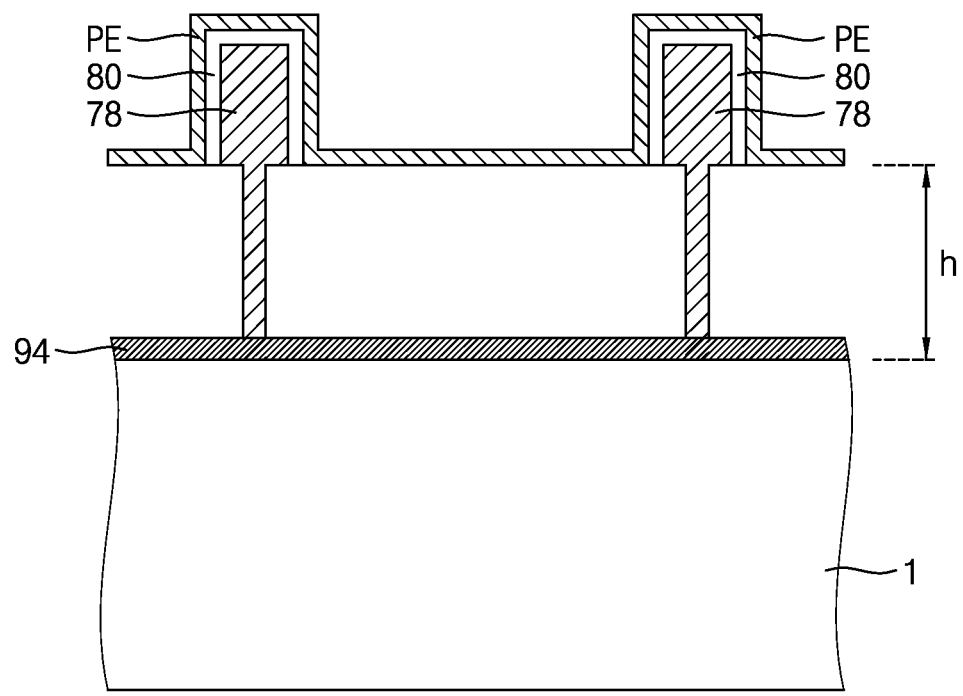
FIG. 10 is a schematic cross-sectional view taken along line A-A' of a part of the pumping capacitor shown in FIG. 9.

FIG. 10 is a schematic cross-sectional view taken along line A-A' of a part of the pumping capacitor shown in FIG. 9.

Referring to FIG. 10, the third pad electrode may be formed in the third pad electrode region 94 on the p-type substrate 1. Lower electrodes 78 of the cell capacitors C may be formed on the third pad electrode. Dielectrics 80 surrounding the lower electrodes 78 of the cell capacitors C may be formed, and the plate electrode PE may be formed on the dielectrics 80. The plate electrode PE may be a common upper electrode of the cell capacitors C. Like the cell capacitors C of the memory cells MC3 and MC4 shown in FIG. 7, the cell capacitors C of the pumping capacitor C1 may be formed at a height h from the p-type substrate 1.

Figure 11:
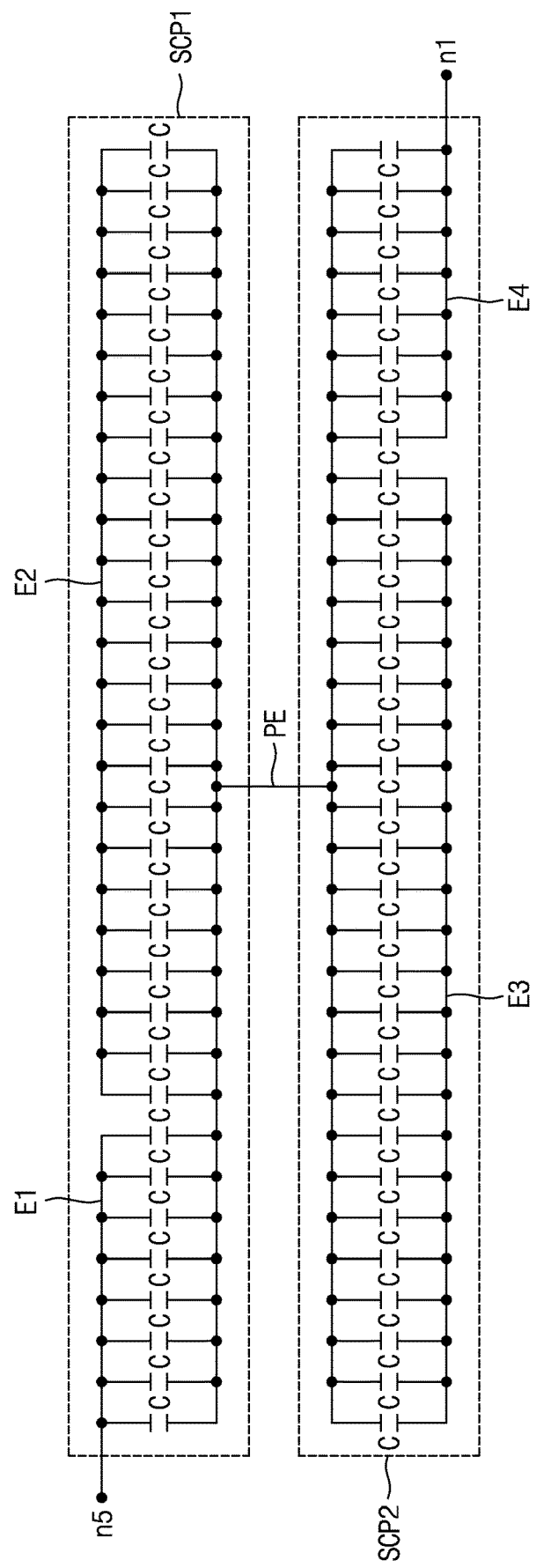
FIG. 11 is a diagram showing a circuit configuration of a pumping capacitor according to an example embodiment.

FIG. 11 is a diagram showing a circuit configuration of a pumping capacitor according to an example embodiment.

Referring to FIG. 11, first and second sub-pumping capacitor groups SCP1 and SCP2 connected in series between a node n5 and a node n1 connected to a signal line to which the pumping control signal P2 is applied may be included. The first sub-pumping capacitor group SCP1 may include 8 cell capacitors C connected in parallel between a first pad electrode E1 connected to the node n5 and the plate electrode PE, and 24 cell capacitors C connected in parallel between a second pad electrode E2 and the plate electrode PE. The 24 cell capacitors C connected in parallel between the second pad electrode E2 and the plate electrode PE may be floated.

The second sub pumping capacitor group SCP2 may include 8 cell capacitors C connected in parallel between the plate electrode PE and a fourth pad electrode E4 connected to the node n1, and 24 cell capacitors C connected in parallel between the plate electrode PE and a third pad electrode E3. The 24 cell capacitors C connected in parallel between the plate electrode PE and the third pad electrode E3 may be floated.

For example, if the capacitance of a cell capacitor C is c, the capacitance of the first sub-pumping capacitor group SCP1 is 8c and the capacitance of the second sub-pumping capacitor group SCP2 is 8c, and thus the capacitance of the pumping capacitor C1 is 4c. That is, the capacitance of the pumping capacitor C1 is determined by the 8 cell capacitors C connected to each of the first pad electrode E1 and the fourth pad electrode E4, and the 24 cell capacitors C connected to each of the floated second and third pad electrodes E2 and E3 do not affect the capacitance of the pumping capacitor C1.

Figure 12:
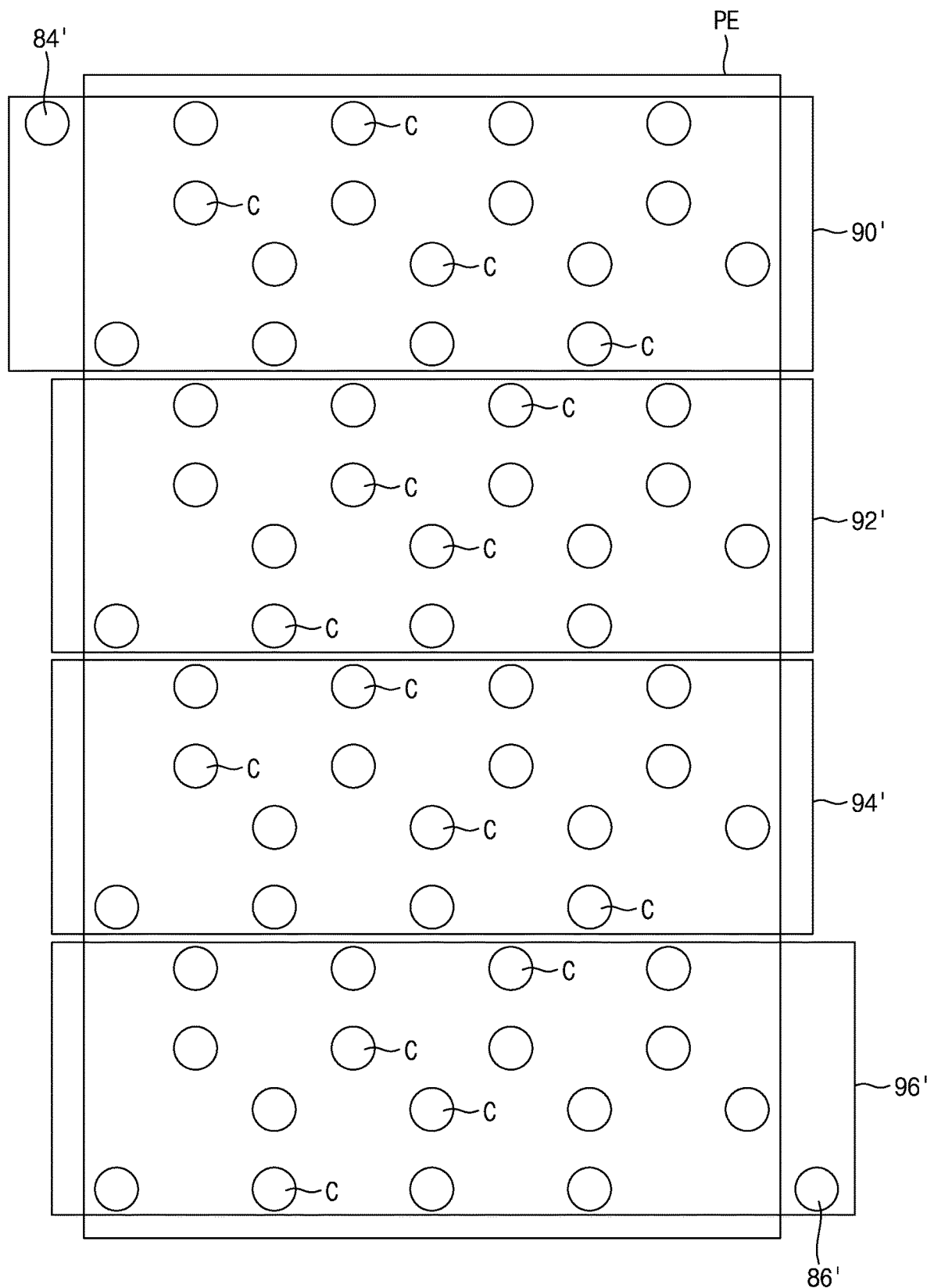
FIG. 12 is a plan view illustrating an arrangement of a pumping capacitor according to an example embodiment.

FIG. 12 is a plan view illustrating an arrangement of a pumping capacitor according to an example embodiment.

The pumping capacitor C2 and the pumping capacitor C3 may each include cell capacitors C on a partial block PMCA in a manner similar to the partial block PMCA discussed above with respect to FIG. 9. The arrangement of the pumping capacitor C2 or the pumping capacitor C3 will be described with reference to FIG. 12 as follows.

The cell capacitors C of the pumping capacitor C2 and the pumping capacitor C3 have the same pattern (interval) as the cell capacitors C of the partial block PMCA shown in FIG. 5.

Cell capacitors C of the pumping capacitor C2 or the pumping capacitor C3 may be repeatedly arranged in the same manner as the cell capacitors C of the partial block PMCA shown in FIG. 5, that is, in the same pattern (at equal intervals).

A first pad electrode may be disposed in a first pad electrode area 90', a second pad electrode may be disposed in a second pad electrode area 92', a third pad electrode may be disposed in a third pad electrode area 94', and a fourth pad electrode may be disposed in a fourth pad electrode region 96'. A contact connected to a signal line to which the pumping control signal P2 or P3 is applied may be disposed in a contact region 84' on one side of the first pad electrode region 90', and a contact connected to the node n2 or n3 may be disposed in a contact area 86' on one side of the fourth pad electrode region 96'. The first pad electrode and the third pad electrode may be floated. The first to fourth pad electrodes may be separately disposed on the substrate.

16 cell capacitors C may be disposed on the first pad electrode, 16 cell capacitors C may be disposed on the second pad electrode, 16 cell capacitors C may be disposed on the third pad electrode, and 16 cell capacitors C may be disposed on the fourth pad electrode. A plate electrode PE serving as upper electrodes of the 64 cell capacitors C may be disposed.

Figure 13:
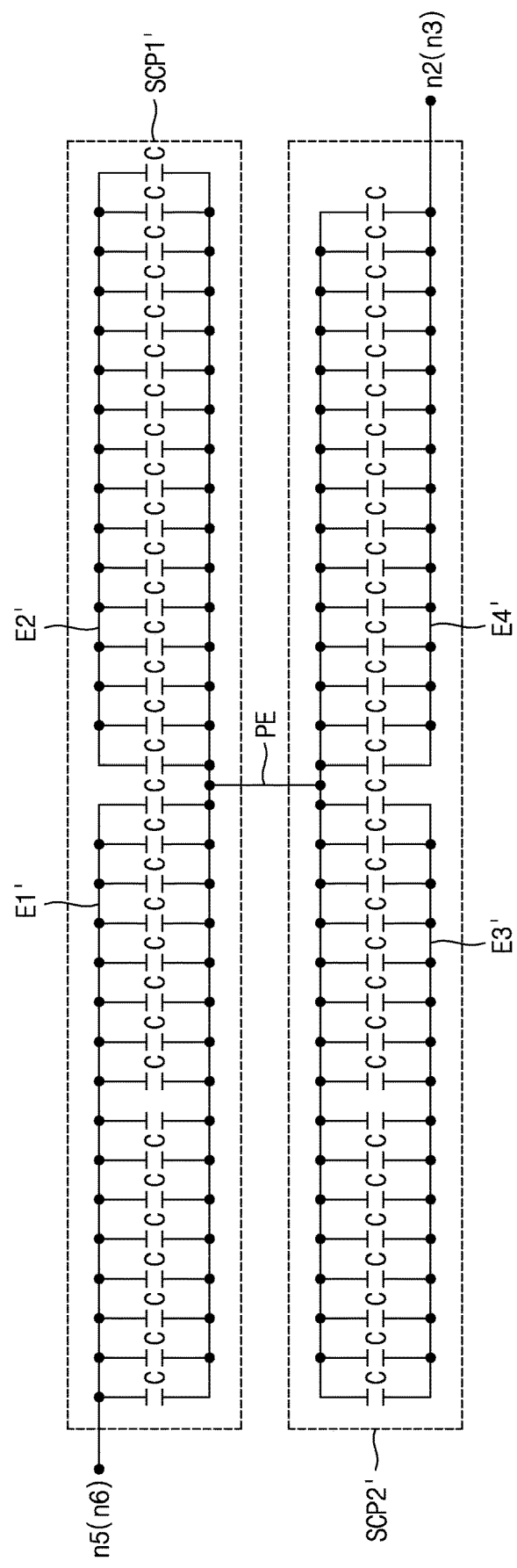
FIG. 13 is a diagram showing a circuit configuration of a pumping capacitor according to an example embodiment.

FIG. 13 is a diagram showing a circuit configuration of a pumping capacitor according to an example embodiment.

Referring to FIG. 13, the pumping capacitor C2 or the pumping capacitor C3 may include first and second sub-pumping capacitor groups SCP1' and SCP2' connected in series between a node n5 or n6 connected to a signal line to which the pumping control signal P2 or P3 is applied and a node n2 or n3.

The first sub-pumping capacitor group SCP1' may include 16 cell capacitors C connected in parallel between a first pad electrode E1' connected to the node n5 or n6 and the plate electrode PE, and 16 cell capacitors C connected in parallel between a second pad electrode E2' and the plate electrode PE. The 16 cell capacitors C connected in parallel between the second pad electrode E2' and the plate electrode PE may be floated.

The second sub-pumping capacitor group SCP2' may include 16 cell capacitors C connected in parallel between the plate electrode PE and a fourth pad electrode E4' connected to the node n2 or n3, and 16 cell capacitors C connected in parallel between the electrode PE and a third pad electrode E3'. The 16 cell capacitors C connected in parallel between the plate electrode PE and the third pad electrode E3' may be floated.

For example, if the capacitance of a cell capacitor C is c, the capacitance of the first sub-pumping capacitor group SCP1' is 16c and the capacitance of the second sub-pumping capacitor group SCP2' is 16c, and thus the capacitance of the pumping capacitor C2 or the pumping capacitor C3 is 8c. That is, the capacitance of the pumping capacitor C2 or the pumping capacitor C3 is determined by the 16 cell capacitors C connected to each of the first pad electrode E1' and the fourth pad electrode E4', and the 16 cell capacitors C connected to each of the floated second and third pad electrodes E2' and E3' do not affect the capacitance of the pumping capacitor C2 or the pumping capacitor C3.

Figure 14:
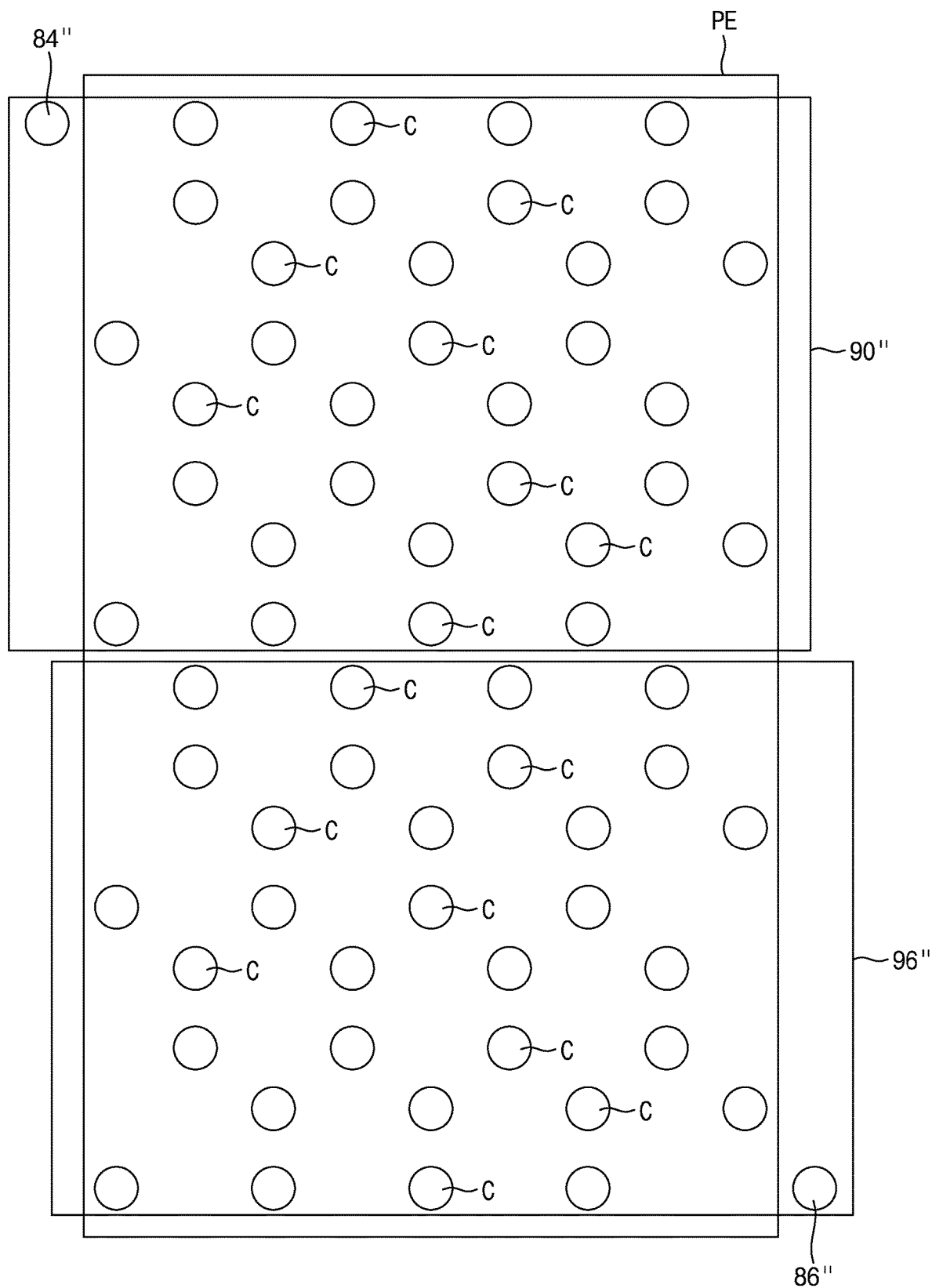
FIG. 14 is a plan view illustrating an arrangement of a pumping capacitor according to an example embodiment.

FIG. 14 is a plan view illustrating an arrangement of a pumping capacitor according to an example embodiment.

The pumping capacitor C4 may include cell capacitors C of memory cells provided on a partial block PMCA in a manner similar to the partial block PMCA discussed above with respect to FIG. 9. The arrangement of the pumping capacitor C4 will be described with reference to FIG. 14 as follows.

Cell capacitors C of the pumping capacitor C4 may be repeatedly arranged in the same manner as the cell capacitors C of the partial block PMCA shown in FIG. 5, that is, in the same pattern (at equal intervals).

A first pad electrode may be disposed in a first pad electrode region 90" and a second pad electrode may be disposed in a fourth pad electrode region 96". A contact connected to a signal line to which the pumping control signal P4 is applied may be disposed in a contact region 84" on one side of the first pad electrode region 90" and a contact connected to a node n4 may be disposed in a contact region 86" on one side of the fourth pad electrode region 96". If the first power lines PPL1 shown in FIG. 2 are lines transmitting a high voltage, the node n4 may be connected to one of the first power lines PPL1. The first pad electrode and the second pad electrode may be separately disposed on the substrate.

32 cell capacitors C may be disposed on the first pad electrode and 32 cell capacitors C may be disposed on the fourth pad electrode. A plate electrode PE serving as upper electrodes of the 64 cell capacitors C may be disposed.

Figure 15:
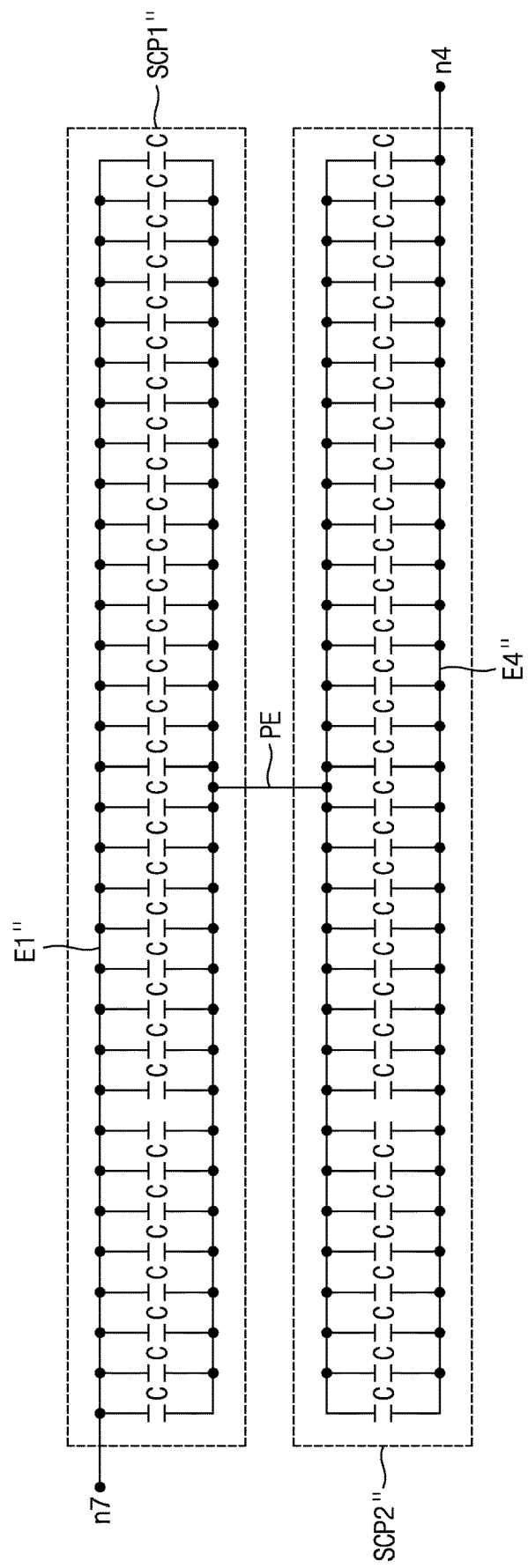
FIG. 15 is a diagram showing a circuit configuration of a pumping capacitor according to an example embodiment.

FIG. 15 is a diagram showing a circuit configuration of a pumping capacitor according to an example embodiment.

Referring to FIG. 15, the pumping capacitor C4 may include first and second sub-pumping capacitor groups SCP1" and SCP2" connected in series between nodes n7 and n4 connected to a signal line to which the pumping control signal P4 is applied.

The first sub pumping capacitor group SCP1" may include 32 cell capacitors C connected in parallel between a first pad electrode E1" connected to the node n7 and the plate electrode PE.

The second sub pumping capacitor group SCP2" may include 32 cell capacitors C connected in parallel between the plate electrode PE and a fourth pad electrode E4" connected to the node n4.

For example, if the capacitance of the cell capacitor C is c, the capacitance of the first sub-pumping capacitor group SCP1" is 32c and the capacitance of the second sub-pumping capacitor group SCP2" is 32c, and thus the capacitance of the pumping capacitor C4 is 16c.

As described above with reference to FIG. 8 to FIG. 15, the capacitances of the pumping capacitors C1 to C4 of the high voltage generator 32-22 may have values of 4c, 8c, 8c, and 16c. In addition, the pumping capacitors C1 to C4 may have the same pattern (interval) as the cell capacitors C of the memory cells of the partial block PMCA of the sub memory cell array SMCA and may be disposed at the same level (height).

Figure 16:
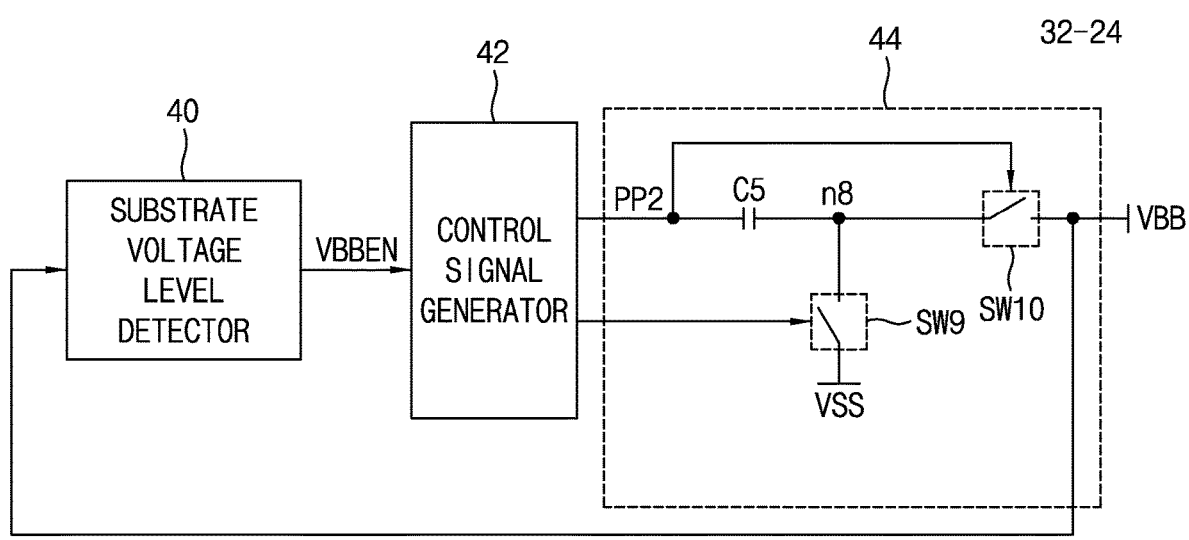
FIG. 16 is a diagram showing a configuration of a pumping voltage generator according to an example embodiment.

FIG. 16 is a diagram showing a configuration of a pumping voltage generator according to an example embodiment, and illustrates a substrate voltage generator 32-24 included in each of the pumping voltage generators 32-2 and 32-4 shown in FIG. 2. The substrate voltage generator 32-24 may include a substrate voltage level detector 40, a control signal generator 42, and a substrate voltage pumping device 44, and the substrate voltage pumping device 44 may include a pumping capacitor C5 and switches SW9 and SW10.

The components shown in FIG. 16 will be described as follows.

The substrate voltage level detector 40 detects the level of the substrate voltage VBB and generates a substrate voltage level detection signal VBBEN when the level of the substrate voltage VBB is higher than a target level of the substrate voltage VBB.

The control signal generator 42 generates a precharge control signal PP1 and a pumping control signal PP2 based on the substrate voltage level detection signal VBBEN.

The switch SW9 precharges a node n8 to the level of a ground voltage GND based on the precharge control signal PP1. The pumping capacitor C5 pumps the node n8 based on the pumping control signal PP2. When the switch SW9 is turned on based on the pumping control signal PP2, an operation of sharing charges between the node n8 and a substrate voltage generation terminal may be performed.

Accordingly, the substrate voltage VBB may be generated at the substrate voltage generation terminal. For example, when the capacitance of the cell capacitor C is c, the pumping capacitor C5 may be designed to have a capacitance of 12c.

Figure 17:
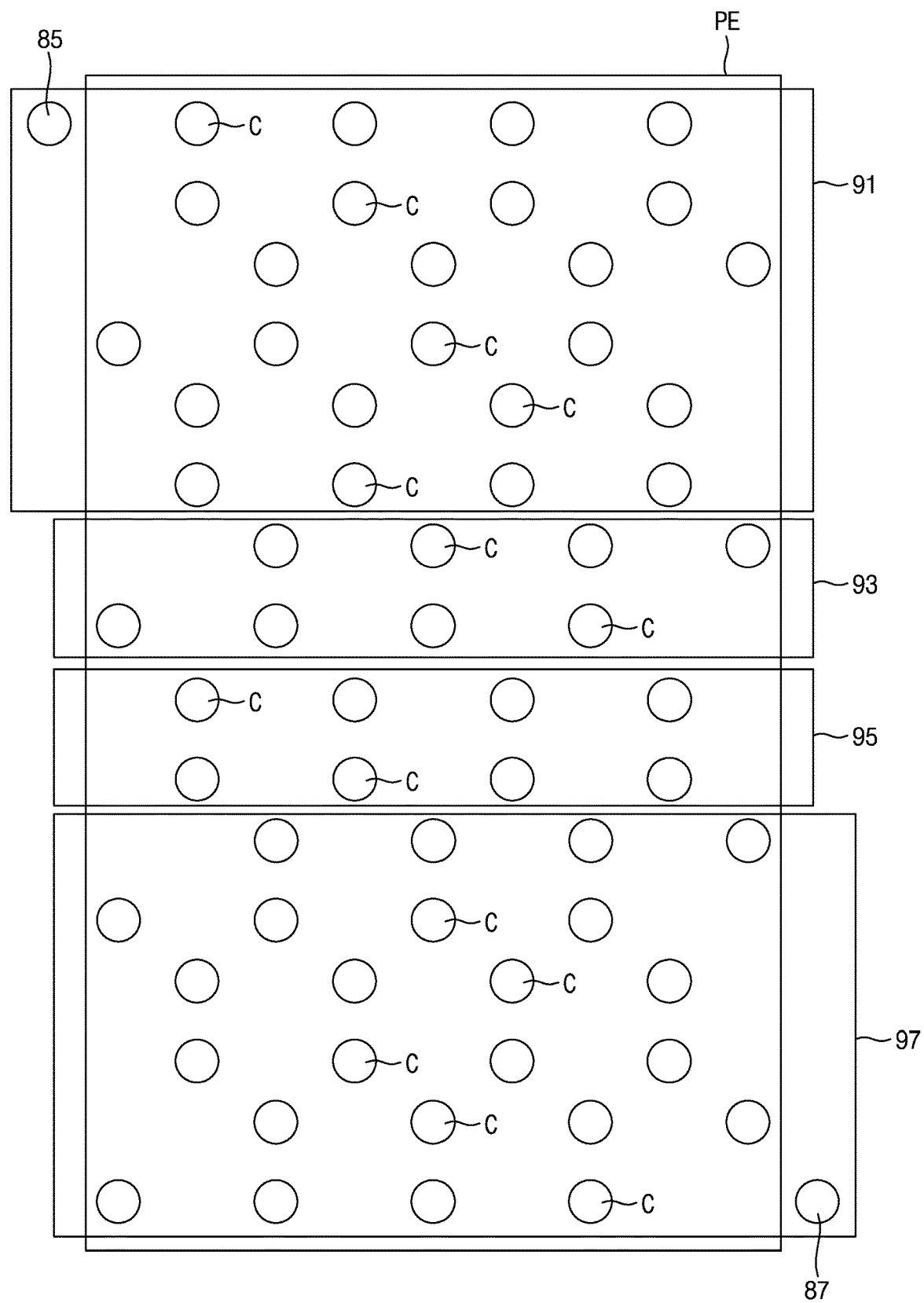
FIG. 17 is a plan view showing an arrangement of a pumping capacitor according to an example embodiment.

FIG. 17 is a plan view showing an arrangement of a pumping capacitor according to an example embodiment.

The pumping capacitor C5 may include cell capacitors C provided on a partial block PMCA in a manner similar to the partial block PMCA discussed above with respect to FIG. 9. The arrangement of the pumping capacitor C5 will be described with reference to FIG. 17 as follows.

Cell capacitors C of the pumping capacitor C5 may be repeatedly arranged in the same manner as the cell capacitors C of the partial block PMCA shown in FIG. 5, that is, in the same pattern (at equal intervals).

A first pad electrode may be disposed in a first pad electrode area 91, a second pad electrode may be disposed in a second pad electrode area 93, a third pad electrode may be disposed in a third pad electrode area 95, and a fourth pad electrode may be disposed in a fourth pad electrode region 97. A contact connected to a signal line to which the pumping control signal PP2 is applied may be disposed in a contact region 85 on one side of the first pad electrode region 91, and a contact connected to a node n8 may be disposed in a contact region 87 on one side of the fourth pad electrode region 97. If the second power lines PPL2 shown in FIG. 2 are lines for transmitting the substrate voltage, the node n8 may be connected to one of the second power lines PPL2. The second pad electrode and the third pad electrode may be floated. The first to fourth pad electrodes may be separately disposed on the substrate.

24 cell capacitors C may be disposed on the first pad electrode, 8 cell capacitors C may be disposed on the second pad electrode, 8 cell capacitors C may be disposed on a third pad electrode, and 24 cell capacitors C may be disposed on the fourth pad electrode. A plate electrode PE serving as upper electrodes of the 64 cell capacitors C may be disposed.

Figure 18:
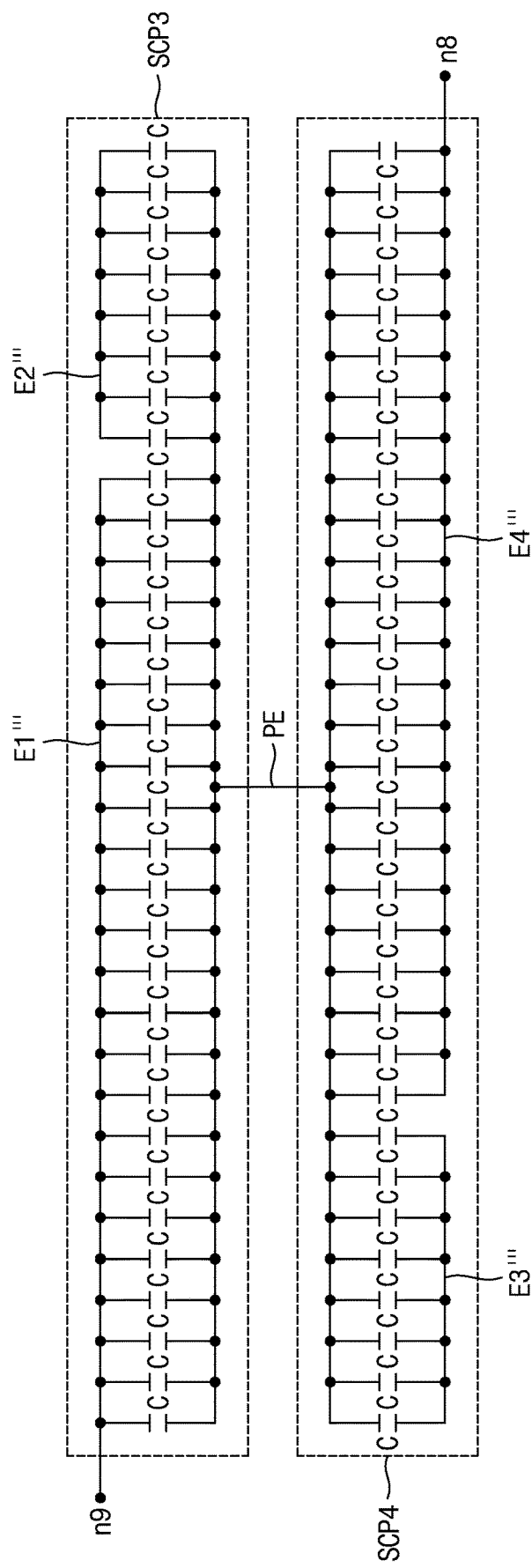
FIG. 18 is a diagram showing a circuit configuration of a pumping capacitor according to an example embodiment.

FIG. 18 is a diagram showing a circuit configuration of a pumping capacitor according to an example embodiment.

Referring to FIG. 18, the pumping capacitor C5 may include first and second sub-pumping capacitor groups SCP3 and SCP4 connected in series between nodes n9 and n8 connected to a signal line to which the pumping control signal PP2 is applied.

The first sub-pumping capacitor group SCP3 may include 24 cell capacitors C connected in parallel between a first pad electrode E'" connected to the node n9 and the plate electrode PE, and 8 cell capacitors C connected in parallel between a second pad electrode E2'" and the plate electrode PE. The 8 cell capacitors C connected in parallel between the second pad electrode E2'" and the plate electrode PE may be floated.

The second sub pumping capacitor group SCP4 may include 24 cell capacitors C connected in parallel between the plate electrode PE and a fourth pad electrode E4'" connected to the node n8, and 8 cell capacitors C connected in parallel between the plate electrode PE and a third pad electrode E3'". The 8 cell capacitors C connected in parallel between the plate electrode PE and the third pad electrode E3'" may be floated.

For example, if the capacitance of the cell capacitor C is c, the capacitance of the first sub-pumping capacitor group SCP3 is 24c and the capacitance of the second sub-pumping capacitor group SCP4 is 24c, and thus the capacitance of the pumping capacitor C5 is 12c. That is, the capacitance of the pumping capacitor C5 is determined by the 12 cell capacitors C connected to each of the first pad electrode E'" and the fourth pad electrode E4'", and the 8 cell capacitors C connected to each of the floated second and third pad electrodes E2'" and E3'" do not affect the capacitance of the pumping capacitor C5.

As described above with reference to FIG. 16 to FIG. 18, the pumping capacitor C5 may have the same pattern (interval) as the cell capacitors C of the memory cells of the partial block PMCA of the sub memory cell array SMCA and may be disposed at the same level (height).

Although the floated second pad electrodes E2, E2', E2" and E2'" and third pad electrodes E3, E3', E3" and E3'" are formed of a conductive material like the first pad electrodes E1, E1', E1" and E'" and the fourth pad electrode E4, E4', E4" and E4'" and configured such that no voltage is applied thereto in the above-described example embodiments, the floated second pad electrodes E2, E2', E2" and E2'" and third pad electrodes E3, E3', E3" and E3'" may be formed of an insulating material on the substrate.

Although the pumping capacitors C1 to C5 are disposed in the same manner as the cell capacitors C of the two partial blocks PMCA of the sub memory cell array block SMCA in the above-described example embodiments, the pumping capacitors C1 to C5 may be disposed in the same manner as cell capacitors C of three or more partial blocks PMCA. The number of cell capacitors included in the pumping capacitors C1 to C5 may be a number sufficient to prevent inclination of the cell capacitors which may occur at the time of manufacturing.

Although the pumping capacitors C1 to C5 have the same pattern (interval) as the cell capacitors C of the memory cells of the two partial blocks PMCA of the sub memory cell array SMCA and are disposed at the same level (height) in the above-described example embodiment, they may be disposed at a different levels (height) and in different patterns (interval).

Figure 19:
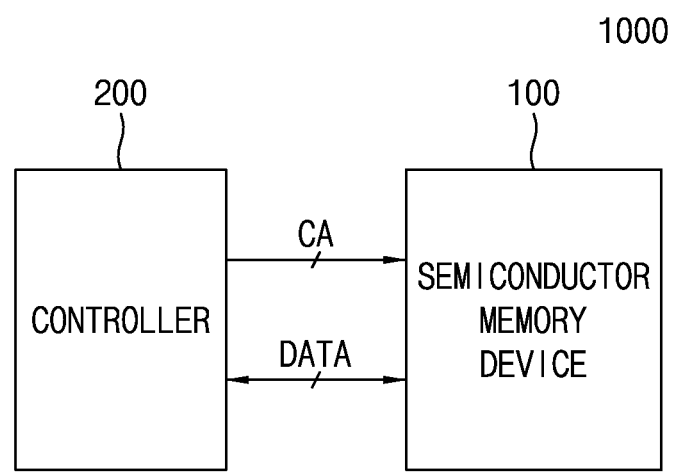
FIG. 19 is a block diagram showing a memory system according to an example embodiment.

FIG. 19 is a block diagram showing a memory system according to an example embodiment. The memory system 1000 may include a semiconductor memory device 100 and a controller 200. The controller 200 may be a central processing unit (CPU), a graphics processing unit (GPU), or the like. The semiconductor memory device 100 may be the semiconductor memory device described above with reference to FIG. 1 to FIG. 18. That is, the semiconductor memory device 100 may include the pumping voltage generators 32-2 and 32-4 in the peripheral circuit area 32.

Referring to FIG. 19, the controller 200 may generate a command and address CA and may transmit/receive data DQ. The semiconductor memory device 100 may transmit/receive the data DQ based on the command and address CA.

For example, in the semiconductor memory device 100, when a command signal included in a command and address CA applied from the controller 200 indicates a write command WR or a read command RD, and an address signal included in the command and address CA designates the sub word line WL1 of the sub memory cell array block SMCA11 of the memory bank MB1 disposed in the memory cell array region 20 of FIG. 1 to FIG. 4 and a column selection signal CSL11, data DQ may be written to memory cells selected by the sub word line WL1 of the sub memory cell array block SMCA11 and the column selection signal CSL11 or data DQ may be read from the selected memory cells.

The pumping capacitors of the above-described example embodiments may be implemented and used in an integrated circuit device other than a semiconductor memory device.

According to example embodiments, a desired capacitance of a pumping capacitor can be obtained using cell capacitors.

In addition, by implementing a pumping capacitor using cell capacitors, the size (area) of the pumping capacitor can be reduced and current consumption can be decreased as compared to a case in which the pumping capacitor is implemented using MOS capacitors.

At least one of the components, elements, modules or units (collectively "components" in this paragraph) represented by a block in the drawings may be embodied as various numbers of hardware, software and/or firmware structures that execute respective functions described above, according to an example embodiment. These components may include, for example, internal clock signal generator 10, the command and address generator 12, the mode set register 14, the latency controller 16, the pumping voltage generator 18, the row decoder 22, the column decoder 24, the data read path interface 26, the data write path interface 28, the high voltage level detector 34, the control signal generator 36, the substrate voltage level detector 40, the control signal generator 42, and the controller 200, shown in FIGS. 1, 4, 8, 16 and 19, not being limited thereto. At least one of these components may use a direct circuit structure, such as a memory, a processor, a logic circuit, a look-up table, etc., that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. For example, an IP unit may include blocks of circuitry performing specific functions, and may have a design that includes a trade secret.

While aspects of example embodiments have been particularly shown and described, it will be understood that various changes in form and details may be made therein without departing from the spirit and scope of the following claims.

What is claimed is:

1. A semiconductor memory device comprising: a plurality of memory cell array banks, each comprising a plurality of memory cells provided in a predetermined pattern between a plurality of sub word lines and a plurality of bit lines on a substrate; and a plurality of pumping voltage generators each comprising at least one pumping capacitor provided in a peripheral circuit area on the substrate, wherein each of the plurality of memory cells comprises an access transistor and a first cell capacitor, wherein the at least one pumping capacitor comprises a first sub pumping capacitor group comprising n second cell capacitors and a second sub pumping capacitor group comprising n third cell capacitors, wherein the first sub pumping capacitor group and the second sub pumping capacitor group are connected in series, wherein i second cell capacitors among the n second cell capacitors of the first sub pumping capacitor group are connected in parallel, (n−i) second cell capacitors of the first sub pumping capacitor group are floated, i third cell capacitors among the n third cell capacitors of the second sub pumping capacitor group are connected in parallel, and (n−i) third cell capacitors of the second sub pumping capacitor group are floated, and wherein n and i are positive integers.

2. The semiconductor memory device according to claim 1, wherein the n second cell capacitors and the n third cell capacitors are provided on the substrate in the peripheral circuit area in a pattern which corresponds to the first cell capacitor of each of the plurality of memory cells.

3. The semiconductor memory device according to claim 2, wherein the n second cell capacitors, the n third cell capacitors and the first cell capacitor are formed at a common height on the substrate.

4. The semiconductor memory device according to claim 2, wherein the at least one pumping capacitor further comprises: a first pad electrode formed on the substrate and to which lower electrodes of the i second cell capacitors of the first sub pumping capacitor group are connected; a second pad electrode formed on the substrate and to which lower electrodes of the i third cell capacitors of the second sub pumping capacitor group are connected; and a plate electrode forming upper electrodes of the n second cell capacitors and the n third cell capacitors, and wherein lower electrodes of the (n−i) second cell capacitors of the first sub pumping capacitor group are floated, and lower electrodes of the (n−i) third cell capacitors of the second sub pumping capacitor group are floated.

5. The semiconductor memory device according to claim 4, wherein the at least one pumping capacitor further comprises: a third pad electrode formed on the substrate and to which lower electrodes of the (n−i) second cell capacitors of the first sub pumping capacitor group are connected; and a fourth pad electrode formed on the substrate and to which lower electrodes of the (n−i) third cell capacitors of the second sub pumping capacitor group are connected, and wherein the third pad electrode and the fourth pad electrode are floated.

6. The semiconductor memory device according to claim 2, wherein each of the plurality of memory cell array banks comprises a plurality of sub memory cell array blocks, wherein each of the plurality of sub memory cell array blocks comprises a plurality of partial blocks, wherein the first cell capacitor of each of the plurality of memory cells is provided in the plurality of partial blocks, and wherein the n second cell capacitors and the n third cell capacitors are provided in a layout which corresponds to the first cell capacitor of each of the plurality of memory cells.

7. The semiconductor memory device according to claim 6, wherein each of the plurality of pumping voltage generators comprises: a high voltage generator which comprises a plurality of first pumping capacitors and is configured to generate a high voltage based on a power supply voltage; and a substrate voltage generator which comprises at least one second pumping capacitor and is configured to generate a substrate voltage based on a ground voltage.

8. The semiconductor memory device according to claim 7, wherein a first pad electrode is formed on the substrate and is connected to lower electrodes of the i second cell capacitors of the first sub pumping capacitor group, wherein a second pad electrode is formed on the substrate and is connected to lower electrodes of the i third cell capacitors of the second sub , and wherein a plate electrode is formed on upper electrodes of the n second cell capacitors and the n third cell capacitors, wherein lower electrodes of the (n−i) second cell capacitors of the first sub pumping capacitor group are floated, and lower electrodes of the (n−i) third cell capacitors of the second sub pumping capacitor group are floated, and wherein a capacitance of each of the plurality of first pumping capacitors and the at least one second pumping capacitor is determined by capacitances of the i second cell capacitors of the first sub pumping capacitor group and capacitances of the i third cell capacitors of the second sub pumping capacitor group.

9. The semiconductor memory device according to claim 8, wherein a third pad electrode is formed on the substrate and is connected to lower electrodes of the (n−i) second cell capacitors of the first sub pumping capacitor group, wherein a fourth pad electrode is formed on the substrate and is connected to lower electrodes of the (n−i) third cell capacitors of the second sub pumping capacitor group, and wherein the third pad electrode and the fourth pad electrode are floated.

10. A memory system comprising: a controller; and a semiconductor memory device configured to transceive data based on a command and an address provided by the controller, wherein the semiconductor memory device comprises: a plurality of memory cell array banks, each comprising a plurality of memory cells provided in a predetermined pattern between a plurality of sub word lines and a plurality of bit lines on a substrate; and a plurality of pumping voltage generators each including at least one pumping capacitor provided in a peripheral circuit area on the substrate, wherein each of the plurality of memory cells comprises an access transistor and a first cell capacitor, wherein the at least one pumping capacitor comprises a first sub pumping capacitor group comprising n second cell capacitors and a second sub pumping capacitor group comprising n third cell capacitors, wherein the first sub pumping capacitor group and the second sub pumping capacitor group are connected in series, wherein i second cell capacitors among the n second cell capacitors of the first sub pumping capacitor group are connected in parallel, (n−i) second cell capacitors of the first sub pumping capacitor group are floated, i third cell capacitors among the n third cell capacitors of the second sub pumping capacitor group are connected in parallel, and (n−i) third cell capacitors of the second sub pumping capacitor group are floated, wherein n and i are positive integers.

11. The memory system according to claim 10, wherein the n second cell capacitors and the n third cell capacitors are provided on the substrate in the peripheral circuit area in a pattern which corresponds to the first cell capacitor of each of the plurality of memory cells, and wherein the n second cell capacitors, the n third cell capacitors and the first cell capacitor of each of the plurality of memory cells are formed at a common height on the substrate.

12. The memory system according to claim 11, wherein the at least one pumping capacitor further comprises: a first pad electrode formed on the substrate and to which lower electrodes of the i second cell capacitors of the first sub pumping capacitor group are connected; a second pad electrode formed on the substrate and to which lower electrodes of the i third cell capacitors of the second sub pumping capacitor group are connected; and a plate electrode forming upper electrodes of the n second cell capacitors and the n third cell capacitors, and wherein lower electrodes of the (n−i) second cell capacitors of the first sub pumping capacitor group are floated, and lower electrodes of the (n−i) third cell capacitors of the second sub pumping capacitor group are floated.

13. The memory system according to claim 12, wherein the at least one pumping capacitor further comprises: a third pad electrode formed on the substrate and to which lower electrodes of the (n−i) second cell capacitors of the first sub pumping capacitor group are connected; and a fourth pad electrode formed on the substrate and to which lower electrodes of the (n−i) third cell capacitors of the second sub pumping capacitor group are connected, and wherein the third pad electrode and the fourth pad electrode are floated.

14. The memory system according to claim 12, wherein each of the plurality of memory cell array banks comprises a plurality of sub memory cell array blocks, wherein each of the plurality of sub memory cell array blocks comprises a plurality of partial blocks, wherein the first cell capacitor of each of the plurality of memory cells is provided in the plurality of partial blocks, wherein the n second cell capacitors and the n third cell capacitors are provided in a layout which corresponds to the first cell capacitor of each of the plurality of memory cells.

15. The memory system according to claim 14, wherein each of the plurality of pumping voltage generators comprises: a high voltage generator which comprises a plurality of first pumping capacitors and is configured to generate a high voltage based on a power supply voltage; and a substrate voltage generator which comprises at least one second pumping capacitor and is configured to generate a substrate voltage based on a ground voltage.

16. The memory system according to claim 15, wherein the first pad electrode is connected to lower electrodes of the i second cell capacitors of the first sub pumping capacitor group, wherein the second pad electrode is connected to lower electrodes of the i third cell capacitors of the second sub pumping capacitor group, wherein a plate electrode is formed on upper electrodes of the n second cell capacitors and the n third cell capacitors, wherein lower electrodes of the (n−i) second cell capacitors of the first sub pumping capacitor group are floated, and lower electrodes of the (n−i) third cell capacitors of the second sub pumping capacitor group are floated, and wherein a capacitance of each of the plurality of first pumping capacitors and the at least one second pumping capacitor is determined by capacitances of the i second cell capacitors of the first sub pumping capacitor group and capacitances of the i third cell capacitors of the second sub pumping capacitor group.

17. The memory system according to claim 16, wherein a third pad electrode is formed on the substrate and is connected to lower electrodes of the (n−i) second cell capacitors of the first sub pumping capacitor group, wherein a fourth pad electrode is formed on the substrate and is connected to lower electrodes of the (n−i) third cell capacitors of the second sub pumping capacitor group, and wherein the third pad electrode and the fourth pad electrode are floated.

* * * * *